(12) United States Patent
Kawasaki

(10) Patent No.: US 7,851,948 B2
(45) Date of Patent: Dec. 14, 2010

(54) SEMICONDUCTOR DEVICE

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 260 days.

(21) Appl. No.: 12/122,114

(22) Filed: May 16, 2008

(65) Prior Publication Data

US 2008/0296977 A1 Dec. 4, 2008

(30) Foreign Application Priority Data

May 31, 2007 (JP) .............................. 2007-146201

(51) Int. Cl.
*H01H 47/00* (2006.01)
(52) U.S. Cl. ...................................... 307/130
(58) Field of Classification Search ................. 307/130, 307/112; 365/226
See application file for complete search history.

(56) References Cited

U.S. PATENT DOCUMENTS 7,202,700 B2 * 4/2007 Isono .......................... 326/81

FOREIGN PATENT DOCUMENTS

JP 2005-175269 A 6/2005

OTHER PUBLICATIONS

Philippe Royannez et al., "90nm Low Leakage SoC Design Techniques for Wireless Applications" ISSCC Dig. Tech. Papers, vol. Paper 7.6, pp. 138-139, Feb. 2005.
Yusuke Kanno et al., "Hierarchical Power Distribution with 20 Power Domains in 90-nm Low Power Multi-CPU Processor", ISSCC Dig. Tech. Papers, Paper 29.4, pp. 540-541, Feb. 2006.

* cited by examiner

*Primary Examiner*—Michael Rutland Wallis
(74) *Attorney, Agent, or Firm*—Arent Fox LLP

(57) ABSTRACT

A semiconductor device includes that a first power line supplied with first power supply voltage, a second power line supplied with second power supply voltage, a third power line electrically connected to a internal circuit; a first switch configured to electrically connect or disconnect the first power line and the third power line, a second switch configured to electrically connect or disconnect the second power line and the third power line, and a control circuit controlling the second switch to electrically connect the first power line and the third power line following a predetermined period after the first power line and the third power line are electrically connected each other based on the first switch.

14 Claims, 12 Drawing Sheets

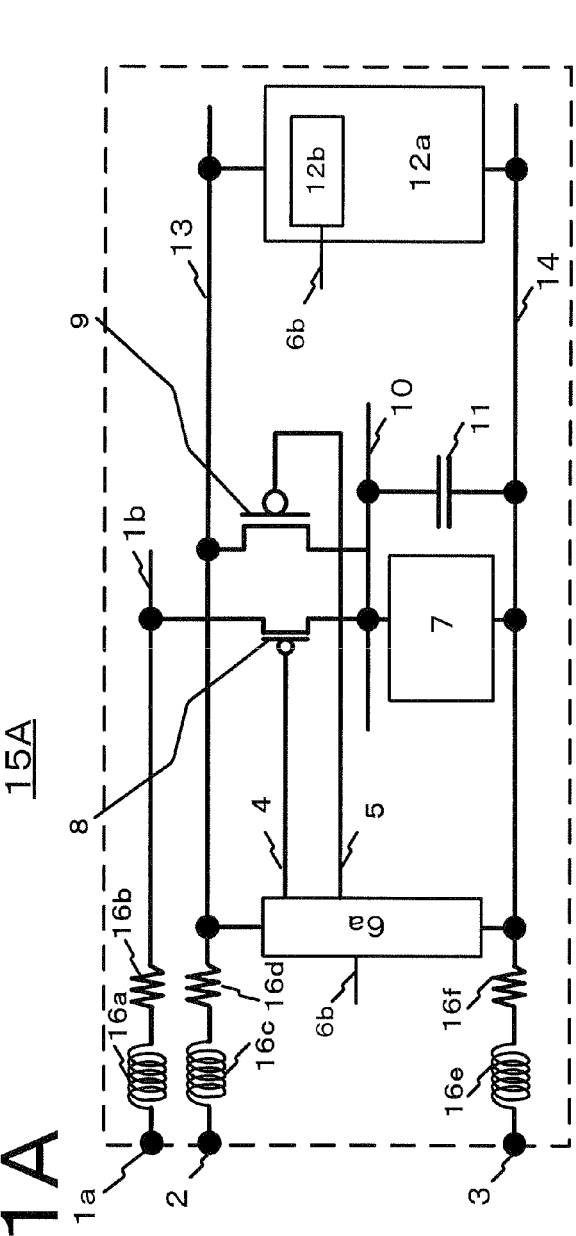
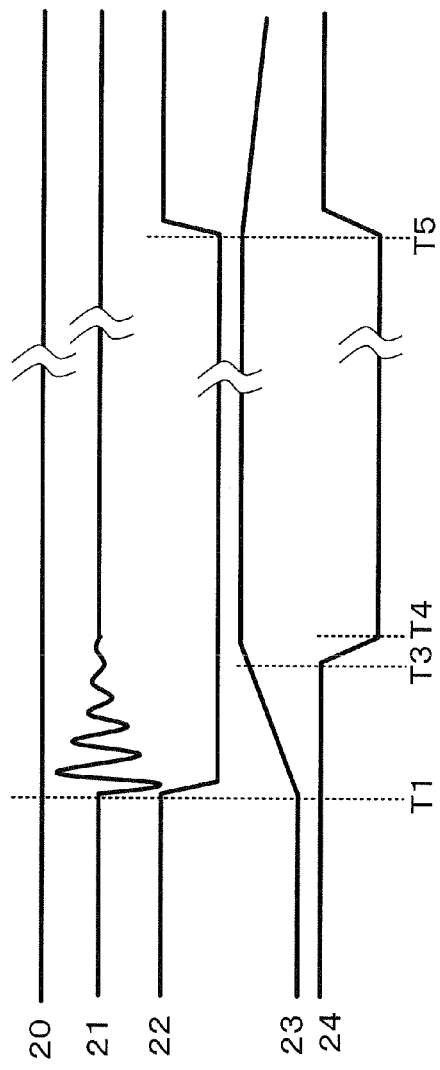
FIG.1A
FIG.1B

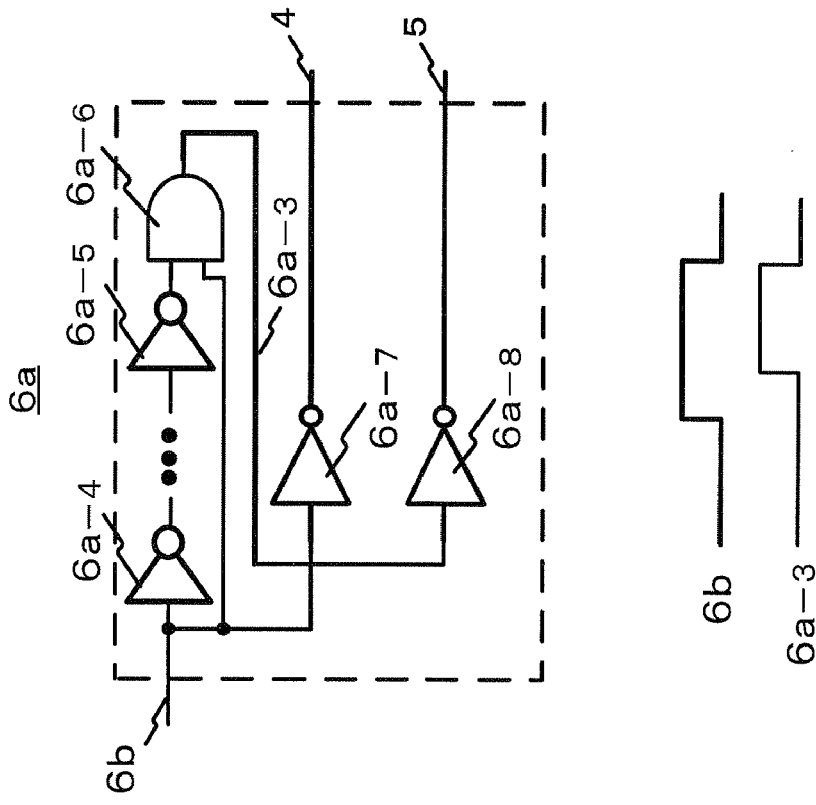
FIG.2B
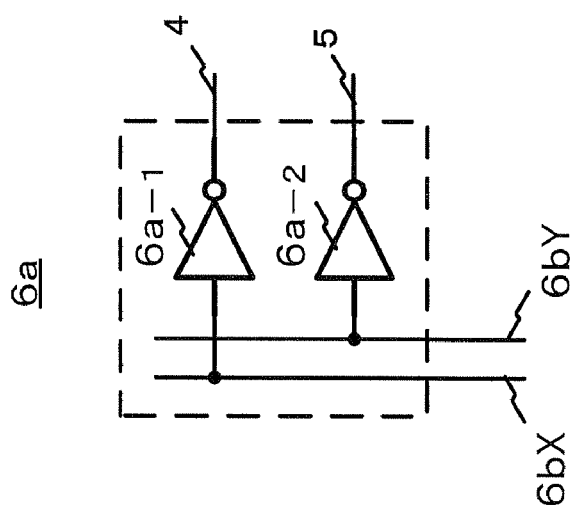
FIG.2A
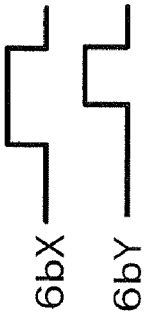

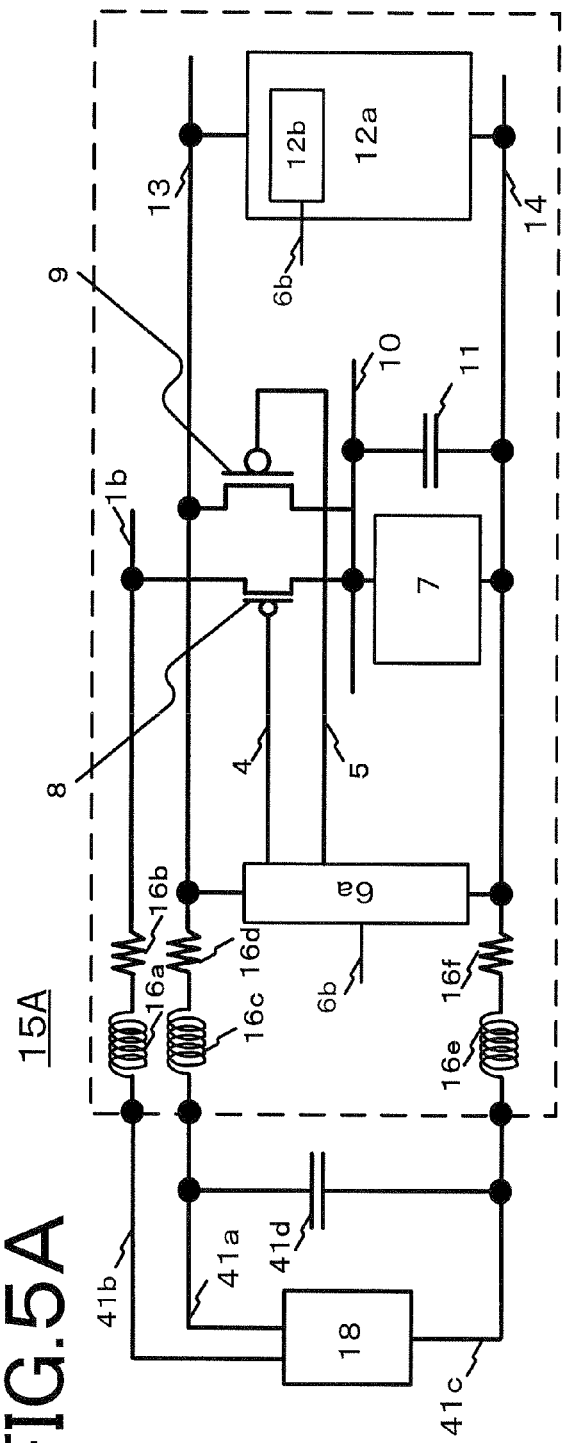
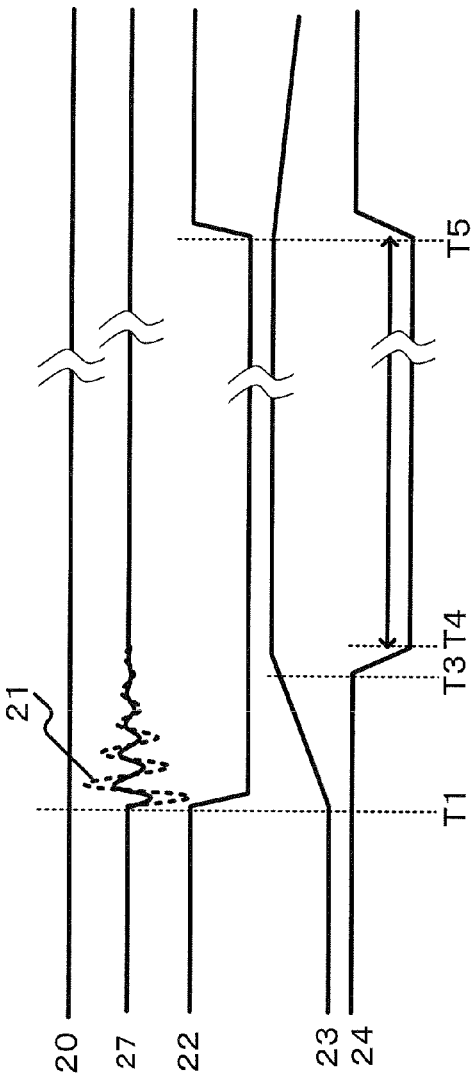
FIG.5A
FIG.5B

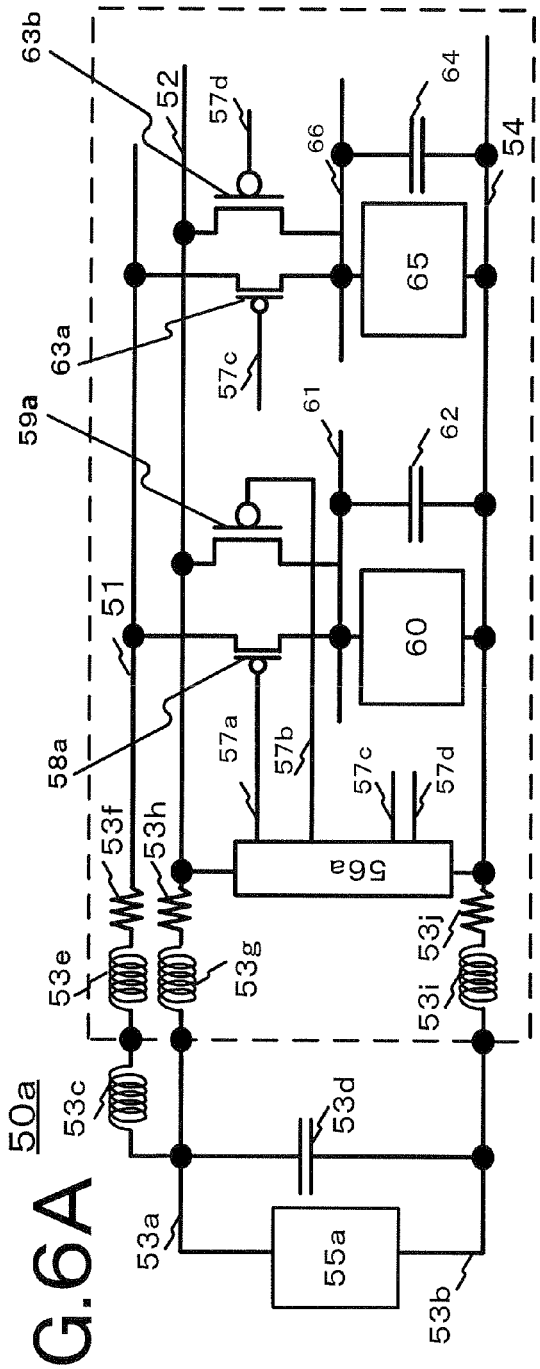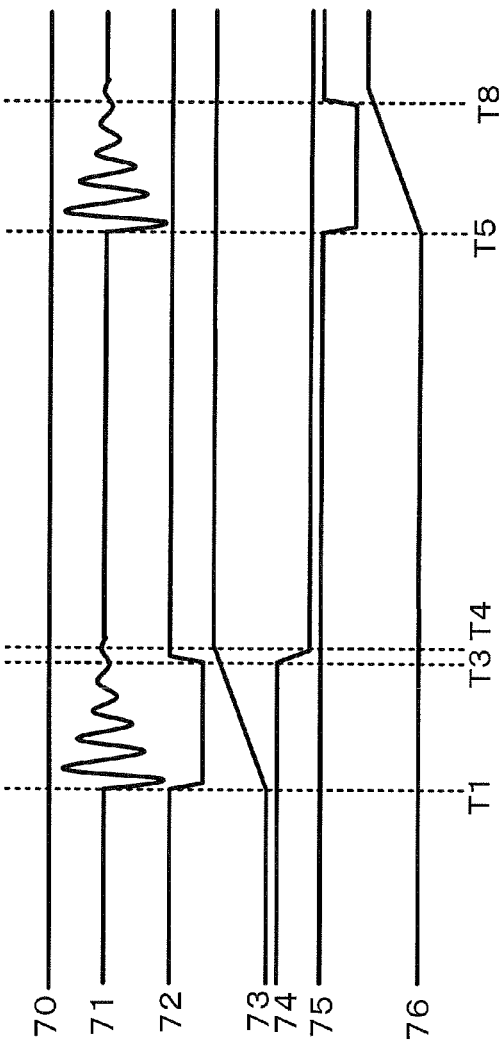
FIG.6A
FIG.6B

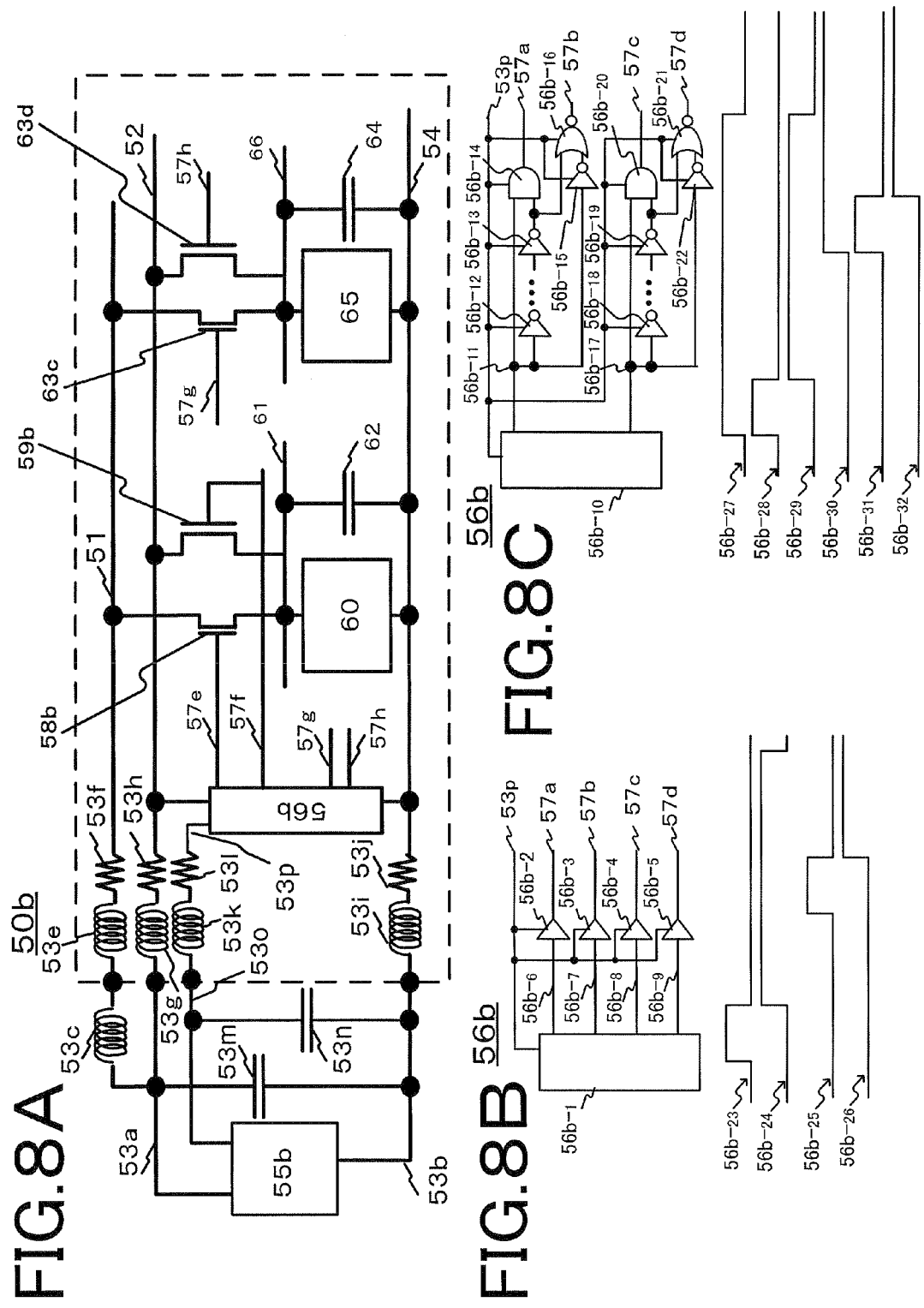

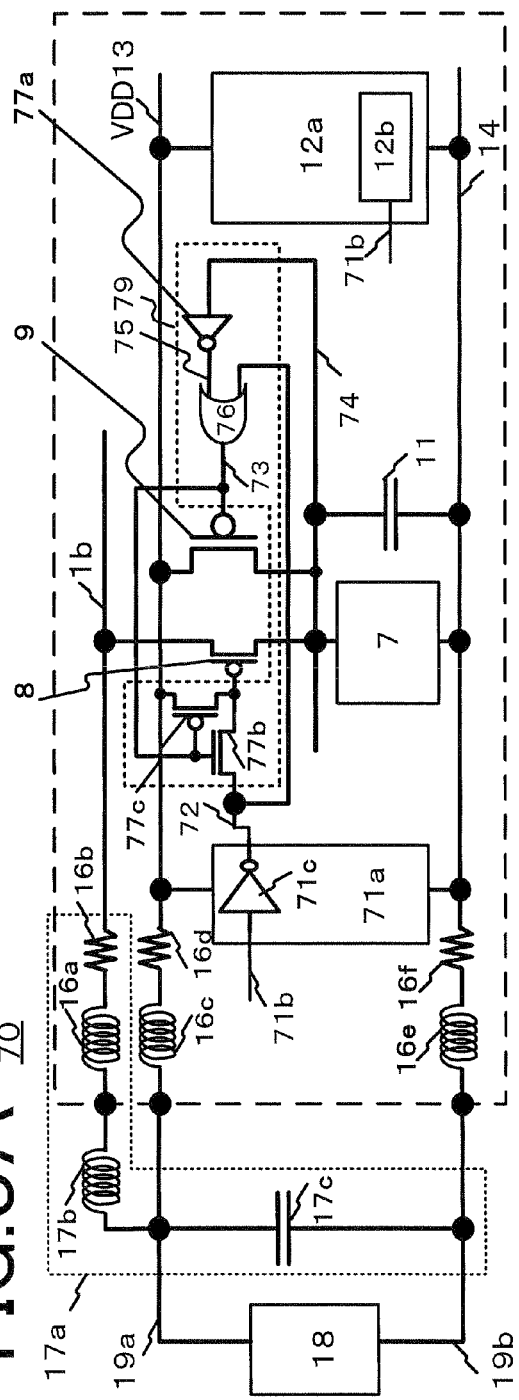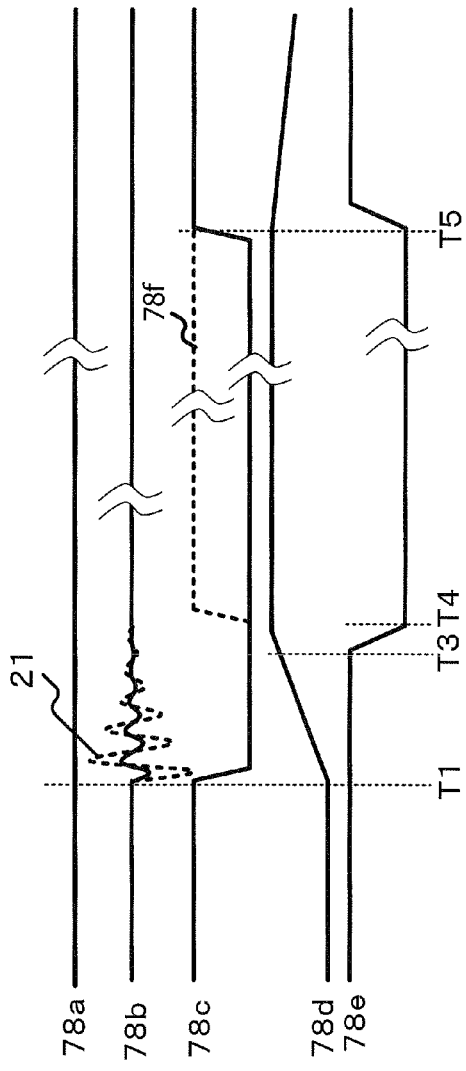

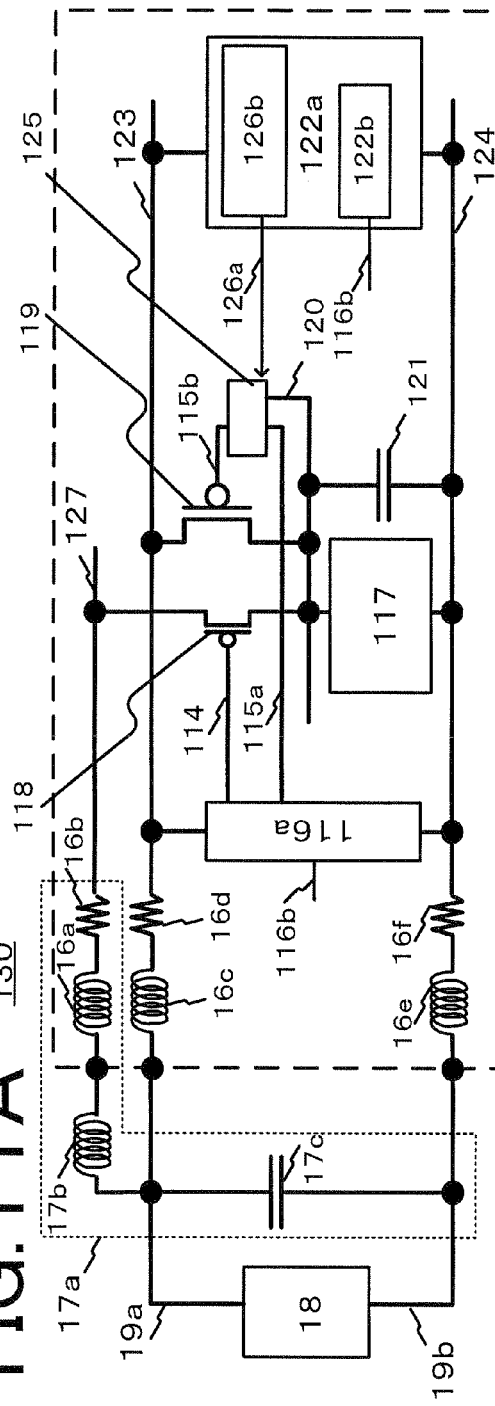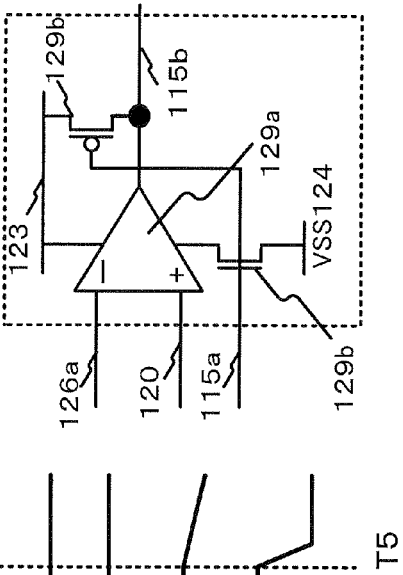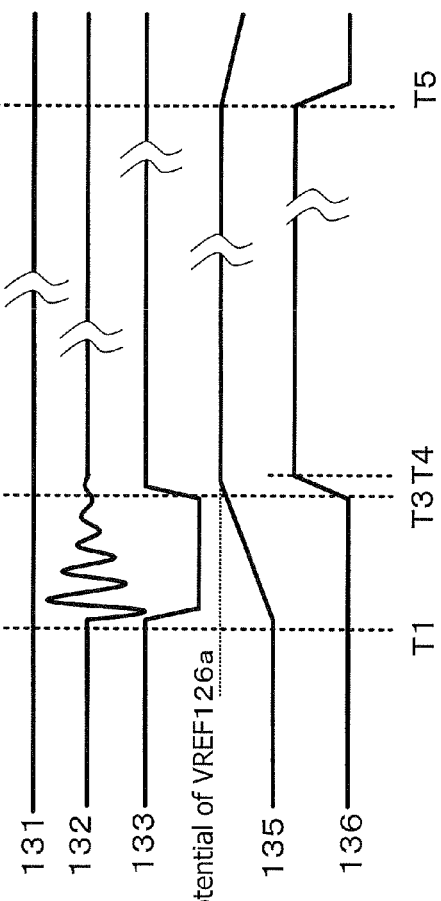
FIG.11A
FIG.11C
FIG.11B

SEMICONDUCTOR DEVICE

CROSS-REFERENCE TO RELATED APPLICATIONS

This application claims the benefit of priority of Japanese Patent Application No. 2007-146201 filed on May 31, 2007, the entire contents of which are incorporated herein by reference.

BACKGROUND

1. Technical Filed

The present application relates to a semiconductor device.

2. Description of the Related Art

LSIs (large scale integrated circuit) having a so-called power-gating function, which is a function for disconnecting power source partially in an internal circuit to reduce power consumption, are becoming commonplace.

LSIs having power-gating functions are designed to perform restoring of power voltage of the internal circuit within a predetermined period of time. However, if the restoring time is short, current suddenly flows to a stability capacity provided along with the internal circuit upon restoring from a power-disconnected state to a power-connected state, so power noise occurs in a power line connected to the internal circuit. Thus, designs for LSIs having a power-gating function require suppressing or preventing of the occurrence of power noise which might lead to erroneous operation of the LSI.

In order to shorten the time for restoring power, a discussion has been made in Japanese Laid-open Patent Publication No. 2005-175269, wherein the voltage of the power line in the internal circuit is sharply increased by connecting a precharged capacity power line to the power line in the internal circuit.

In addition, proposals such as those below have been made relating to suppressing or preventing the occurrence of power noise, (e.g., "90 nm Low Leakage SoC Design Techniques for Wireless Applications", ISSCC Dig. Tech. Papers, Paper 7.6, pp. 138-139, February, 2005 and "Hierarchical Power Distribution with 20 Power Domains in 90-nm Low-Power Multi-CPU Processor", ISSCC Dig. Tech. Papers, Paper 29.4, pp. 540-541, February, 2006). "90 nm Low Leakage SoC Design Techniques for Wireless Applications", ISSCC Dig. Tech. Papers, Paper 7.6, pp. 138-139, February, 2005 discusses a method to gradually increase the potential of the internal power line by providing a power switch with a low current supply capability, and a power switch with a high current supply capability, between the internal power line and the power line with voltage constantly maintained, and turning on the switches in sequence from the switch with the low current supply capability. In addition, "Hierarchical Power Distribution with 20 Power Domains in 90-nm Low-Power Multi-CPU Processor", ISSCC Dig. Tech. Papers, Paper 29.4, pp. 540-541, February, 2006) discusses a method whereby, in order to drive a control line of the power switch connecting between the internal power line and the power line with voltage constantly maintained, a transistor with a weak driving capability and a transistor with a strong driving capability is connected to the control line of the power switch, whereby a control signal is gradually raised by the transistor having the weak driving function, and thereafter the control signal is raised with the transistor having the strong driving capability. This is to suppress the current supply capability of the power switch by gradually activating the control signal potential in order to suppress sudden current from flowing into the power line of the internal circuit.

There is a problem in that power noise occurs due to shortening the time for power line voltage in the internal circuit to be restored in typical LSI.

In addition, there is a problem in that the restoring time of power voltage in the internal circuit is lengthened by suppressing the current flowing between the power line maintaining constant voltage and the power line in the internal circuit, and by suppressing the occurrence of power noise in typical LSI.

SUMMARY

According to one aspect of embodiments, a semiconductor device includes that a first power line supplied with first power supply voltage, a second power line supplied with second power supply voltage, a third power line electrically connected to a internal circuit; a first switch configured to electrically connect or disconnect the first power line and the third power line, a second switch configured to electrically connect or disconnect the second power line and the third power line, and a control circuit controlling the second switch to electrically connect the first power line and the third power line following a predetermined period after the first power line and the third power line are electrically connected each other based on the first switch.

BRIEF DESCRIPTION OF THE DRAWINGS

FIG. 1A is a diagram illustrating a semiconductor device according to a first embodiment (LSI 15A), and FIG. 1B illustrates potential waveforms at each of the nodes, accompanying the operation thereof;

FIGS. 2A and 2B are diagrams showing circuit examples of a PMU 6a shown in FIG. 1A;

FIG. 5A is a diagram illustrating the semiconductor device (LSI 15A) relating to a fourth embodiment, and FIG. 5B illustrates the potential waveforms at each of the nodes accompanying the operation of the semiconductor device (LSI 15A);

FIG. 6A is a diagram illustrating a semiconductor device according to a fifth embodiment (LSI 50), and FIG. 6B illustrates potential waveforms at each of the nodes, accompanying the operation thereof;

FIG. 8A is a modification example of the semiconductor device according to the fifth embodiment, and FIGS. 8B and 8C illustrate a first circuit example and second circuit example of the PMU 56b of the modification example thereof;

FIG. 9A is a diagram illustrating a semiconductor device according to a sixth embodiment (LSI 70), and FIG. 9B illustrates potential waveforms at each of the nodes, accompanying the operation thereof;

FIG. 11A is a diagram illustrating a semiconductor device according to an eighth embodiment (LSI 130, inductor 17b, and capacitor 17c), and FIG. 11B illustrates potential waveforms at each of the nodes, accompanying the operation thereof, and FIG. 11C illustrates a circuit example of a step-down control unit 125.

DESCRIPTION OF THE EMBODIMENTS

Figures 3A, 3B:
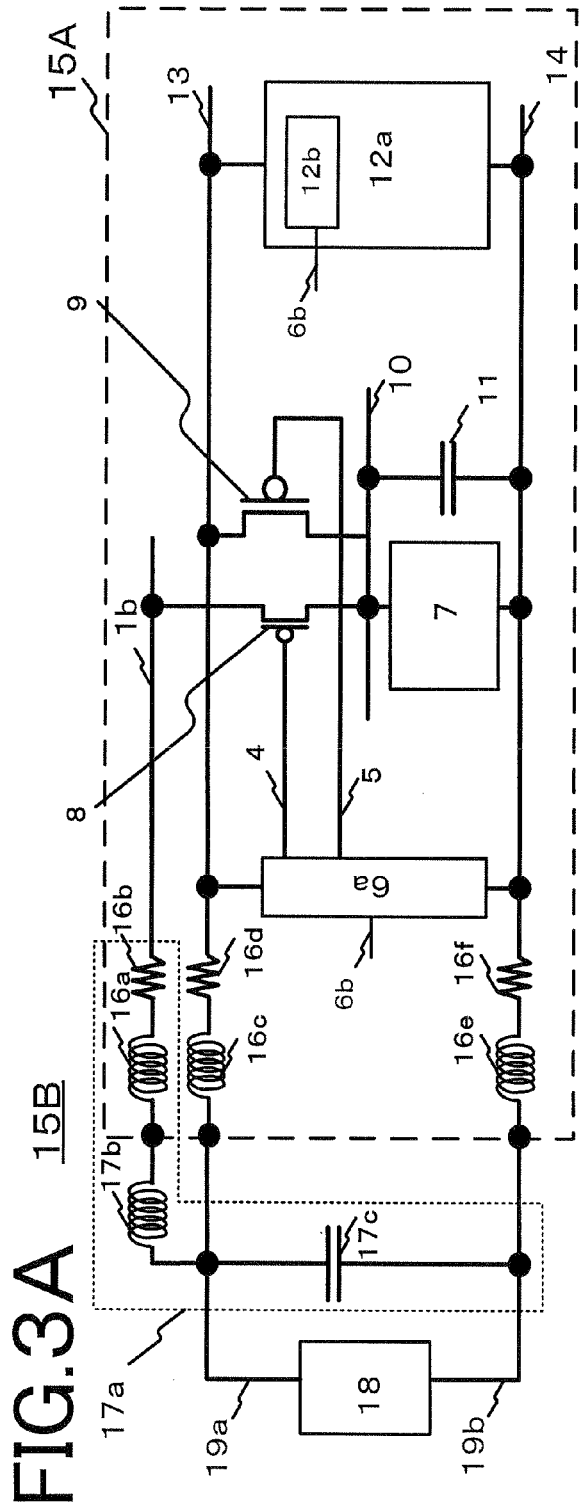
FIG. 3A is a diagram illustrating a semiconductor device according to a second embodiment (LSI 15B)
FIG. 3B illustrates potential waveforms at each of the nodes accompanying the operation thereof.

First through eighth embodiments will be described below. Note that the present invention is not limited to these embodiments.

First Embodiment

The first embodiment relates to a semiconductor device having a first power line (VDDG1 (1b)) and second power line (VDD 13) wherein a constant voltage is constantly maintained, a third power line (VDDM 10) of the internal circuit connected to the second power line after being connected to the first power line, a first switch to connect/disconnect the first power line and third power line, a second switch to connect/disconnect the second power line and third power line, and a control circuit to control the on/off of the first and second switches and the sequence of the on/off thereof.

FIG. 1A is a diagram illustrating a semiconductor device according to the first embodiment (LSI 15A), and FIG. 1B illustrates potential waveforms at each of the nodes accompanying the operation thereof. FIG. 1A illustrates a circuit diagram of the LSI 15A of the first embodiment. The LSI 15A has an external terminal including an external application VDD 2, external application VDDG1 (1a), and has an external terminal including an external application VSS 3, has nodes including a node G1 (4) and node G2 (5), and has a code signal 6b. The LSI 15A has an inductor 16a based on a coil formed with wiring, an inductor 16c based on a coil formed with wiring, an inductor 16e based on a coil formed with wiring, a resistor 16b, resistor 16d, resistor 16f, a gating transistor 8, gating transistor 9, a power line VDDG1 (1b) to apply high potential, power line VDD 13 to apply high potential, a power line VSS 14 to apply low potential, a circuit A 7 within the LSI 15A, a circuit B 12a within the LSI 15A, the power line VDDM 10 to connect to the circuit A 7, a stability capacitor C11, and a PMU (Power Managing Unit) 6a.

The circuit A 7 is an internal circuit within the LSI 15A. The circuit A 7 is connected to the power line VDDM 10 and the power line VSS 14 applying a low potential (grounding potential).

A stability capacitor C11 connects between the power line VDDM 10 and the power line VSS 14 applying low potential. The stability capacitor C11 serves to stabilize the potential of the circuit A 7.

The power line VDDM 10 is connected to the drain of the gating transistor 8, and is connected to the power line VDDG1 (1b) which applies high potential, via the gating transistor 8. In addition, the power line VDDM 10 is connected to the drain of the gating transistor 9, and is connected to the power line VDD 13 which applies high potential via the gating transistor 9.

A gate electrode of the gating transistor 8 is connected to the node G1 (4). The gate electrode of the gating transistor 9 is connected to the node G2 (5). Accordingly, the potential of the node G2 (5) is controlled, whereby the connection/disconnection between the circuit A 7 and the power line VDD 13 is controlled. The potential of node G1 (4) is controlled, whereby the connection/disconnection between the circuit A 7 and the power line VDDG1 (1b) is controlled.

Note that the gating transistor 8 and gating transistor 9 are configured of a p-type transistor in the present embodiment. This is because in the case of supplying high potential to the circuit A 7 via the p-type transistor, the high potential from the power lines (VDDG1 (1b), VDD 13) is transmitted without change to the p-type transistor, uninfluenced by a threshold.

However, the gating transistor 8 and gating transistor 9 in addition may be formed with an n-type transistor. In such a case, the high potential is transmitted without change, whereby it is desirable that the logical level "H" potential of the signal output from a later-described PMU 6a to the node G1 (4) and node G2 (5) is a potential higher than the above-mentioned high potential by an amount of the threshold of the n-type transistor or greater. In the case of supplying high potential to the circuit A 7 via the n-type transistor, in the event that a signal having roughly the same amount of potential as the high potential therein is connected to the gate electrode of the n-type transistor, the potential which is low in the amount of the threshold is supplied to the circuit A 7. Note that the LSI 15A receives a supply of high potential greater than the high potential in the amount of threshold of the n-type transistor from an external power source, for example.

The PMU 6a receives the code signal 6b from the CPU (Central Processing unit) 12b, to control the signal output to the node G1 (4) and node G2 (5). The PMU 6a receives the supply of high potential from the power source VDD 13, and receives the supply of the low potential from the power source VSS 14, to operate. Note that an example of the circuit in PMU 6a will be described with reference to FIGS. 2A and 2B.

The CPU 12b is included in a later-described circuit B 12a, is constantly operating, and determines the necessity of the operation of the internal circuit of the circuit A 7 and so forth. Accordingly, turning the power source on/off of the circuit A 7 is performed based on determination by the CPU 12b. Note that with FIG. 1A, the CPU 12b is described as being included in the circuit B 12a, but an arrangement may be made wherein the CPU 12b is outside of the LSI 15A of the first embodiment, and the LSI 15A receives the code signal 6b through the external terminal. In addition, the CPU 12b may be configured so as to be included in the PMU 6a.

In order to restore the potential of the circuit A 7, the power line VDDG1 (1b) which applies high potential is connected to the power line VDDM 10 of the internal circuit with the gating transistor 8. Note that the power line VDDG1 (1b) is connected to an external power source which applies high potential from the external application VDDG1 (1a), which is an external terminal of the LSI 15A, via the inductor 16a and resistor 16b.

The power line VDD 13 which applies high potential applies high potential to the circuit A 7, whereby after the power VDDG1 (1b) is connected to the power line VDDM 10, the power VDDG1 (1b) is connected to the power line VDDM 10 of the internal circuit with the gating transistor 9. Note that the power line VDD 13 is connected to the external power which applies high potential from the external application VDD 2 which is an external terminal of the LSI 15A, via the inductor 16c and resistor 16d.

The power line VSS 14 which applies low potential (ground potential) is connected to an external power which applies ground potential from the external application VSS 3 which is an external terminal of the LSI 15A, via the inductor 16e and resistor 16f.

The circuit 12a is an internal circuit of the LSI 15A which operates by connecting to the power line VDD 13 which applies high potential and the power line VSS 14 which applies low potential.

The power lines VDD 13 and VSS 14 are constantly connected to an external power source, whereby the power source is not turned on/off. Accordingly, this includes the circuit group which is planned to constantly operate, the CPU 12b, or the clock generating circuit and so forth.

FIG. 1B is a diagram illustrating potential waveforms at each of the internal nodes, accompanying the operation of the LSI 15A. That is to say, FIG. 1B illustrates a waveform 20 of the power line VDD 13, a waveform 21 of the power line VDDG1 (1b), a waveform 22 of the node G1 (4), a waveform 24 of the node G2 (5), and a waveform 23 of the power line VDDM 10 to connect the internal circuit A 7 of the LSI 15A.

According to the waveform 20 of the power line VDD 13, the potential of the power line VDD 13 is maintained at a fairly high potential. Until the point-in-time T4, the power line VDD 13 and power line VDDG1 (1b) are not connected via the power line VDDM 10, whereby the power noise of the later-described power line VDDG1 (1b) is not transmitted to power line VDD 13 via the power line VDDM 10. In addition, after point-in-time T4 wherein both power lines (VDD 13 and VDDG1 (1b)) are connected to the power line VDDM 10 of the circuit A 7, the power noise subsides, and the power noise of the power line VDDG1 (1b) is not transmitted to the power line VDD 13 via the power line VDDM 10 of the circuit A 7.

According to the waveform 21 of the power line VDDG1 (1b), fluctuation of potential having high frequency components, i.e. so called power noise, appears in the power line VDDG1 (1b) immediately after the power line VDDG1 (1b) is connected to the power line VDDM 10 with the gating transistor 8 at point-in-time T1. This is because current suddenly flows from the power line VDDG1 (1b) as to the power line VDDM 10, whereby the potential of the power line VDDG1 (1b) becomes unstable. After this, the fluctuation of potential (power noise) converges at the power line VDDG1 (1b), and a constant high potential is maintained.

According to the waveform 22 of the node G1 (4), the node G1 (4) indicates the logical level "H" having high potential from the power line VDD 13, but thereafter, the gating transistor 8 is turned on at point-in-time T1, whereby the node G1 (4) indicates the logical level "L" having low potential from the power line VSS 14. Further, thereafter, the gating transistor 8 is turned off at point-in-time T5, whereby the PMU 6a outputs a signal indicating the logical level "H" to the node G1 (4).

Consequently, as the waveform 23 of the power line VDDM 10 indicates, the potential of the power line VDDM 10 which is connected to the circuit A 7 begins to increase, and the voltage is restored to the point of potential supplied by the power line VDDG1 (1b). Thereafter, when the gating transistor 8 and gating transistor 9 are turned off at point-in-time T5, the potential of the power line VDDM 10 naturally drops since the circuit A 7 consumes current.

According to the waveform 24 of the node G2 (5), the node G2 (5) indicates the logical level "H" having high potential indicated by the power line VDD 13 before point-in-time T3, and thereafter the gating transistor 9 is turned on at point-in-time T3, whereby the node G2 (5) indicates the logical level "L" having low potential supplied from the power line VSS 14. Thereafter, the gating transistor 9 is turned off, whereby the PMU 6a outputs a signal indicating the logical level "H" to the node G2 (5) at point-in-time T5.

Thus, the LSI 15A according to the first embodiment has a power line VDDG1 (1b), power line VDD 13, and power line VDDM 10. In addition, the LSI 15A according to the first embodiment has a gating transistor 8 to connect/disconnect the power line VDDG1 (1b) and the power line VDDM 10, and a gating transistor 9 to connect/disconnect the power line VDD 13 and the power line VDDM 10. In addition, the LSI 15A according to the first embodiment has a PMU 6a or a PMU 6a and CPU 12b to which voltage is supplied from the power line VDD 13, wherein the gating transistor 8 drives the G1 (4) so as to connect the power line VDDG1 (1b) and the power line VDDM 10, and thereafter, the gating transistor 9 drives the G2 (5) so as to connect the power line VDD 13 and power line VDDM 10.

The circuit A 7 which is subjected to power on/off control is connected to the power line VDDM 10, and the circuit B 12a and PMU 6a which constantly have the power turned on are connected to the power line VDD 13.

With the LSI 15A, in the event that the power source is turned on as to the circuit A 7, power noise occurs only at the power line VDDG1 (1b), and the above-mentioned noise is not propagated to the power line VDD 13 via the power line VDDM 10.

Consequently, there is the advantage that the above-mentioned power noise does not influence the circuit 12a or the circuit within the PMU 6a having a stable operation or constant operation.

For example, the CPU 12b within the circuit 12a and the clock generating circuit are not influenced by the power noise, whereby stable operations is performed.

According to the above-mentioned LSI 15A, current is supplied suddenly from the power line VDDG1 (1b) to the VDDM 10, and the restoring time for the voltage of the power line VDDM 10 is shortened.

FIGS. 2A and 2B are diagrams illustrating a circuit example of the PMU 6a shown in FIG. 1. FIG. 2A shows a first circuit example of the PMU 6a. The PMU 6a shown in FIG. 2A is made up of a signal line 6bX and signal line 6bY which transmit the code signal 6b output from the CPU 12b, an inverter PMU 6a-1, and PMU 6a-2.

The CPU 12b outputs a code signal 6b made up of a signal 6bX according to the node G1 (4) and a signal 6bY according to the node G2 (5), as to the PMU 6a.

The signal 6bX is a pulse signal which normally is the logical level "L", but in order to select the gating transistor 8, assumes the logical level "H" for a fixed period of time.

The signal 6bY is a pulse signal which normally is the logical level "L", but in order to select the gating transistor 9, assumes the logical level "H" for a fixed period of time. However, the signal 6bY becomes a pulse state delayed by a predetermined period of time from the signal 6bX, and simultaneous with the pulse state of the signal 6bX ending, the signal 6bY in addition ends the pulse state thereof. Note that the above-mentioned period of time is determined with the CPU 12b.

The signal 6bX according to the G1 (4) is inversely amplified via the inverter 6a-1, and is output to the node G1 (4).

The signal 6bY according to the G2 (5) is inversely amplified via the inverter 6a-2, and is output to the G2 (5).

With the code signal 6b from the CPU 12b, the PMU 6a in FIG. 2A drives a signal line to control the gating transistor 8 so that the gating transistor 8 connects the power line VDDG1 (1b) and the power line VDDM 10, and after a predetermined period of time thereafter, drives a signal line so that the gating transistor 9 connects the power line VDD 13 and the power line VDDM 10. Consequently, the power noise occurring in the power line VDDG1 (1b) is not propagated to the power line VDD 13. The power noise does not influence the circuit B 12a. Consequently, the circuit B 12a performs stable operations.

FIG. 2B shows a second circuit example of the PMU 6a. The PMU 6a in FIG. 2B is made up of an inverter row which is made up of an even number of inverters including the inverter 6a-4 and inverter 6a-5, an AND 6a-6, inverter 6a-7, inverter 6a-8, and node 6a-3.

The CPU 12b outputs, to the PMU 6a, one code signal 6b to notify the period for selecting the gating transistor 8 and gating transistor 9. The code signal 6b is a pulse signal normally the logical level "L", but during the period for selecting the gating transistor 8, goes to the logical level "H".

Thus, the PMU 6a operates as described below. First, a signal wherein the code signal 6b is inversely amplified is output to the node G1 (4) by the inverter 6a-7.

Next, the code signal 6b which is delayed by the inverter row, and the original code signal 6b, are input into one terminal and the other terminal of the AND 6a-6, whereby the AND 6a-6 has a delayed start of the pulse state as to the node 6a-3, compared to the original code signal 6b, and outputs a signal having a pulse state for a short period of time. Note that the length of the inverter row may be adjusted at the time of design, and the inverter row may estimate the time for the power noise to converge, and thus delay the code signal 6b.

Thereafter, the signal which is output to the node 6a-3 is subjected to inverse amplification with the inverter 6a-8, and is output to the node G2 (5).

With the code signal 6b from the CPU 12b, the PMU 6a in FIG. 2B drives a signal line to control the gating transistor 8 so that the gating transistor 8 connects the power line VDDG1 (1b) and the power line VDDM 10, and after a delay period determined by the inverter row thereafter, drives a signal line so that the gating transistor 9 connects the power line VDD 13 and the power line VDDM 10. Consequently, the power noise occurring in the power line VDDG1 (1b) is not propagated to the power line VDD 13. The power noise does not influence the circuit B 12a. Consequently, the circuit B 12a performs stable operations.

Second Embodiment

The semiconductor device according to a second embodiment is made up of the semiconductor device of the first embodiment (LSI 15A), an LPF (Low Pass Filter) 17a which connects the first power line of the LSI 15A (the power line (VDDG1 (1b)) wherein power noise occurs) and an external power source, and which is externally attached to the LSI 15A. The first embodiment and second embodiment differ in that, with the second embodiment, the first power line and external power source are connected via the LPF (Low Pass Filter) 17a, and the second power line is in addition connected to the same external power source.

FIGS. 3A and 3B are diagrams showing a semiconductor device according to the second embodiment (LSI 15B), and a potential waveform for each node accompanying the operation thereof. FIG. 3A shows the semiconductor device (LSI 15B) according to the second embodiment. The LSI 15B is made up of the LSI 15A, an inductor 17b from an externally attached coil, and an externally attached capacitor 17c for power stabilization. Note that the description of the LSI 15A has already been made with reference to FIGS. 1 and 2, and will be omitted here.

An external power source IC 18 is a normal DC/DC converter. That is to say, a battery serves as the power source, voltage drop due to the current consumed by the LSI 15B is detected, and the external power source IC 18 operates such that the potential difference between the power line VDD 19a applying high potential and the power line VSS 19b applying low potential is maintained at a constant.

The LSI 15B is connected with the external power source IC 18. Specifically, the power line VDD 19a of the external power source IC 18 is connected to the power line VDD 13 via the inductor 16c and resistor 16d. In addition, the power line VDD 19a of the external power source IC 18 is connected to the power line VDDG1 (1b) via the inductor 17b, inductor 16a, and resistor 16b. The power line VSS 19b supplies low potential (e.g. grounding potential) to the LSI 15B. In addition, the power line VDD 19a of the external power IC 18 and the power line VSS 19b supplying the low potential are connected via a capacitor 17c.

Consequently, the inductor 17b, capacitor 17c, inductor 16a, and resistor 16b make up the LPF 17a.

With the LSI 15B, the power noise occurring in the power line VDDG1 (1b) is subjected to removal of the high frequency components of the power noise by the low pass filter LPF 17a. That is to say, virtually no power noise passes through the LPF 17a, so only a small amount thereof is transmitted to the power line VDD 19a. Fluctuations of potential having high frequency components deteriorate, so the power noise is not propagated to the power line VDD 13.

FIG. 3B is a diagram showing the potential waveform of each internal node which accompany the operation of the LSI 15B. FIG. 3B shows the waveform 20 of the power line VDD 13, the waveform 25 of the power line VDD 19a, the waveform 21 of the power line VDDG1 (1b), the waveform 22 of the node G1 (4), the waveform 23 of the power line VDDM 10, and the waveform 24 of the node G2 (5). Description of the waveform described with reference to FIG. 1B will be omitted.

As shown with the waveform 25 of the power line VDD 19a, the power noise shown with the waveform 21 of the power line VDDG1 (1b) indicated by a dotted line deteriorates with the effects of the LPF 17a, so virtually none is transmitted to the power line VDD 19a. This is because the power noise contains a large amount of high frequency components, so the power noise does not pass through the LPF 17a. Thus, according to the semiconductor device of the second embodiment (LSI 15B), the power noise occurring with the power line VDDG1 (1b) is prevented from being transmitted to the power line VDD 13 via the point line VDD 19a via the external power source IC 18.

According to the semiconductor device of the second embodiment (LSI 15B), current may be supplied with the one external power source IC 18, so the number of external power sources IC 18 to be connected is reduced.

Note that with the semiconductor device according to the second embodiment, according to the diagram showing the potential waveform in FIG. 3B, current is supplied from the power line VDDG1 (1b) to the power line VDDM 10 from point-in-time T1 to point-in-time T4, and after the power noise in the power line VDDG1 (1b) converges, the power line VDD 13 is connected to the power line VDDM 10. Accordingly, similar to the first embodiment, the power noise is not propagated to the power line VDD 13 from the power line VDDG1 (1b) via the power line VDDM 10.

According to the semiconductor of the second embodiment, current is supplied suddenly from the power line VDDG1 (1b) to the power line VDDM 10, and the restoring of voltage of the power line VDDM 10 is shortened.

Third Embodiment

The semiconductor device according to a third embodiment is a semiconductor device wherein an LPF 17a connecting the first power line of the LSI 15A (the power line (VDDG1 (1b)) wherein power noise occurs) and the external power source is built in to the semiconductor device according to the first embodiment (LSI 15A). Accordingly, the third embodiment and the second embodiment differ in that the semiconductor device of the third embodiment has the semiconductor device of the first embodiment and the LPF 31 built in.

Figure 4A:
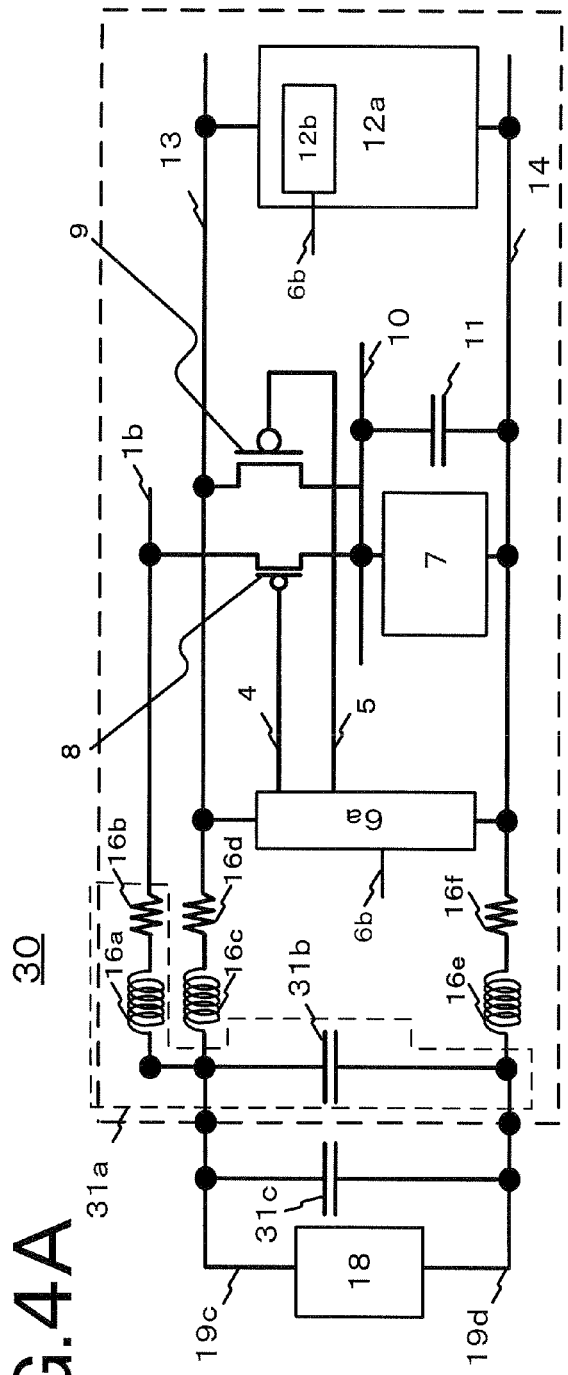
FIG. 4A is a diagram illustrating a semiconductor device according to a third embodiment (LSI 30)
Figure 4B:
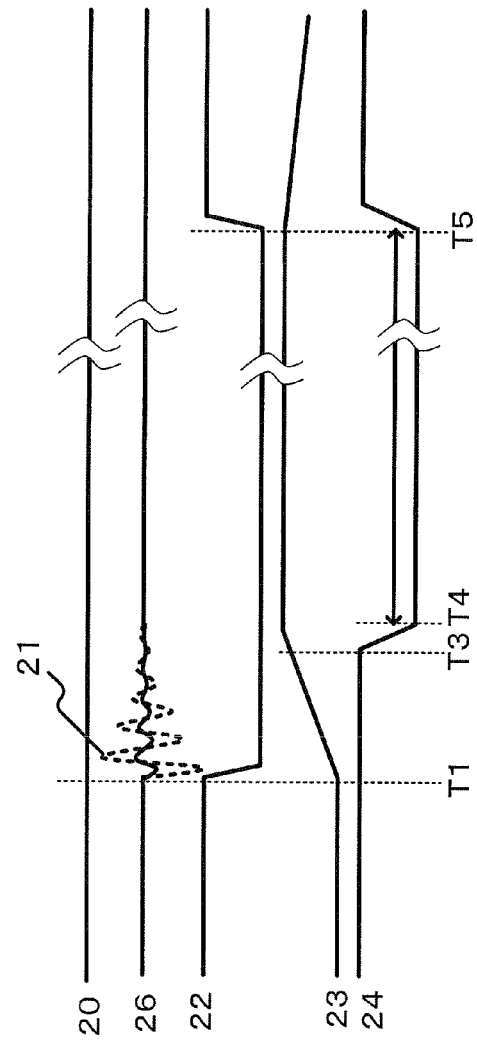
FIG. 4B illustrates potential waveforms at each of the nodes, accompanying the operation thereof.

FIGS. 4A and 4B are diagrams showing the semiconductor according to the third embodiment (LSI 30) and the potential waveform for each node accompanying the operations thereof. FIG. 4A shows the semiconductor device (LSI 30) according to the third embodiment, an externally attached stabilizing capacitor 31c, and external power source IC 18.

The LSI 30 is made up of configuration elements similar to those included in the LSI 15A, and is configured from the capacitor 31b for the purposes of power stabilization. Note that the description of the configuration elements included in the LSI 15A are described with reference to FIGS. 1 and 2, so will be omitted.

The external power source IC 18 is a normal DC/DC converter. That is to say, a battery serves as the power source, voltage drop due to the current consumed by with the LSI 30 is detected, and the external power source IC 18 operates such that the potential difference between the power line VDD 19c applying high potential and the power line VSS 19d applying low potential is maintained at a constant.

The LSI 30 is connected to the external power source IC 18. Specifically, the power line VDD 19c of the external power source IC 18 is connected to the power line VDD 13 via the inductor 16c and resistor 16d. In addition, the power line VDD 19c of the external power source IC 18 is connected to the power line VDDG1 (1b) via the inductor 16a and resistor 16b. The power line VSS 19d supplies low potential (e.g. grounding potential) to the LSI 30. In addition, the power line VDD 19c of the external power source IC 18 and the power line VSS 19d supplying low potential are connected via a capacitor 31b disposed within the LSI 30 and the capacitor 31c externally attached to the LSI 30.

Consequently, the capacitor 31b, inductor 16a, and resistor 16b make up the LPF 31a.

Thus, the LSI 30 and the power line VDD 19c are connected only with one external terminal of the LSI 30, so the number of external terminals of the LSI 30 is reduced.

In addition, with the LSI 30, the power noise occurring with the power line VDDG1 (1b) is subjected to removal of high frequency components of power noise by the low pass filter LPF 31a. That is to say, virtually no power noise passes through the LPF 31a, so only a small amount of power noise is transmitted to the power line VDD 19a. The variances of potential having high frequency components deteriorates further with the inductor 16c and resistor 16d, so the power noise is not propagated to the power line VDD 13.

FIG. 4B is a diagram illustrating potential waveforms at each of the nodes, accompanying the operation thereof. That is to say, FIG. 4B illustrates a waveform 20 of the power line VDD 13, a waveform 26 of the power line VDD 19c, a waveform 21 of the power line VDDG1 (1b), a waveform 22 of the node G1 (4), and a waveform 23 of the power line VDDM 10, and a waveform 24 of the node G2 (5). Description of the waveform described with reference to FIG. 1B will be omitted.

As shown with the waveform 26 of power line VDD 19c, the power noise shown with the waveform 21 of the power line VDDG1 (1b), which is indicated by a dotted line, deteriorates with the effect of the LPF 31a, and only a small amount of the power noise is transmitted to the power line VDD 19c.

Thus, according to the semiconductor device of the third embodiment (LSI 30), the power noise occurring with the power line VDDG1 (1b) is prevented from transmission to the power line VDD 13 via the power line VDD 19c of the external power source IC 18.

According to the semiconductor device of the third embodiment (LSI 30), current is supplied with one external power source IC 18, thereby providing the advantage wherein the number of external power sources IC 18 to be connected is reduced. In addition, with the semiconductor device (LSI 30) of the third embodiment, the external terminals are reduced.

Note that with the semiconductor device of the third embodiment in addition, according to the diagram illustrating the potential waveforms in FIG. 4B, the power line VDDG1 (1b) supplies current to the power line VDDM 10 from point-in-time T1 through point-in-time T4, and the power noise at the power line VDDG1 (1b) converges, after which the power line VDD 13 is connected to the power line VDDM 10. Accordingly, similar to the first embodiment, the power noise will not be transmitted to the power line VDD 13 from the power line VDDG1 (1b) via the power line VDDM 10.

According to the semiconductor device of the third embodiment, current is suddenly supplied from the power line VDDG1 (1b) to the power line VDDM 10, and the restoring of voltage of the power line VDDM 10 is shortened.

Fourth Embodiment

With the fourth embodiment, independent power sources are connected to each of the first power line (VDDG1 (1b)) and second power line (VDD 13) of the semiconductor device according to the first embodiment (LSI 15A), whereby operations of the semiconductor device according to the first embodiment are performed.

FIG. 5A is a diagram illustrating the semiconductor device (LSI 15A) relating to a fourth embodiment, and FIG. 5B illustrates the potential waveforms at each of the nodes accompanying the operation of the semiconductor device (LSI 15A). FIG. 5A illustrates the semiconductor device according to the fourth embodiment (LSI 15A), the externally attached stabilizing capacity 41d, and external power source IC 18.

The LSI 15A is similar to the semiconductor device shown with the first embodiment (LSI 15A), so the description of the LSI 15A will be omitted.

The external power source IC 18 is a normal DC/DC converter. That is to say, a battery serves as the power source, voltage decrease from the current expended with the LSI 15A is detected, and the external power source IC 18 operates such that the potential difference between the power line VDD 41a applying high potential and the power line VSS 41c applying low potential is maintained as a constant. In addition, independent from the above-mentioned operations, the external power source IC 18 operates such that the potential difference between the power line VDD 41b applying the high potential and the power line VSS 41c applying the low potential is maintained as a constant.

The LSI 15A is connected to the external power source IC 18. Specifically, the power line VDD 41a of the external power source IC 18 is connected with the power line VDD 13 via the inductor 16c and resistor 16d. In addition, the power line VDD 41b of the external power source IC 18 is connected to the power line VDDG1 (1b) via the inductor 16a and resistor 16b. The power line VSS 41c supplies the low potential (e.g. grounding potential) to the LSI 15A. In addition, the power line VDD 41a of the external power source IC 18 and the power line VSS 41c supplying the low potential are connected via the capacitance 41d which is externally attached to the LSI 15A.

Thus, even in the case that power noise then occurs with the power line VDDG1 (1b) and is transmitted to the power line VDD 41b, the power noise converges with the operations of the external power source IC 18. Therefore, power noise is not propagated from the power line VDD 41b to the power line VDD 41a via a power line within the external power source IC 18.

FIG. 5B illustrates the potential waveforms at each of the nodes accompanying the operation of the LSI 15A. FIG. 5B illustrates a waveform 20 of the power line VDD 13, a waveform 27 of the power line VDD 41b, a waveform 21 of the power line VDDG1 (1b), a waveform 22 of the node G1 (4), a waveform 23 of the power line VDDM 10, and a waveform 24 of the node G2 (5). Description of the waveforms described with reference to FIG. 1B will be omitted.

As shown with the waveform 27 of the power line VDD 41b, the power noise shown with the waveform 21 of the power line VDDG1 (1b) indicated by a dotted line deteriorates with operations by the external power source IC 18, and the power noise is not propagated to the power line VDD 41a. This is because the external power source IC 18 operates so as to assure the fluctuations of potential. Thus, if the semiconductor device (LSI 15A) and the external power source IC 18 are connected as shown with the fourth embodiment, the power noise occurring with the power line VDDG1 (1b) is prevented from being transmitted to the power line VDD 13 via the external power source IC 18.

Note that if the semiconductor device (LSI 15A) and external power source IC 18 are connected as shown with the fourth embodiment, as indicated with the potential waveforms in FIG. 5B, the power line VDDG1 (1b) supplies current to the power line VDDM 10 from point-in-time T1 through point-in-time T4, and the power noise at the power line VDDG1 (1b) converges, after which the power line VDD 13 is connected to the power line VDDM 10. Accordingly, the power noise will not be transmitted from the power line VDDG1 (1b) to the power line VDD 13 via the power line VDDM 10, similar to the first embodiment.

According to the semiconductor device of the fourth example, current is suddenly supplied from the power line VDDG1 (1b) to the power line VDDM 10, and restoring of the voltage of the power line VDDM 10 is reduced.

Fifth Embodiment

The fifth embodiment relates to a semiconductor device having a first power line (VDDG1 (51)) and second power line (VDD 52) wherein a constant voltage is constantly maintained, a third power line (VDDM1 (61)) of a first internal circuit (circuit A 60) connected to the second power line after being connected to the first power line, a fourth power line (VDDM 2 (66)) of a second internal circuit (circuit B 65) connected to the second power line after being connected to the first power line, a first switch to connect/disconnect the first power line and third power line, a second switch to connect/disconnect the second power line and third power line, a third switch to connect/disconnect the first power line and fourth power line, a fourth switch to connect/disconnect the second power line and fourth power line, and a control circuit to control the on/off of the first through fourth switches and the sequence of the on/off thereof.

FIG. 6A is a diagram illustrating a semiconductor device (LSI 50) according to the fifth embodiment, and FIG. 6B illustrates potential waveforms at each of the nodes, accompanying the operation thereof. FIG. 6A illustrates a circuit diagram of the LSI 50a of the fifth embodiment.

An external power source IC 55a is a normal DC/DC converter. That is to say, a battery serves as the power source, voltage drop from the current consumed by an LSI 50a is detected, and an external power source IC 55a operates such that the potential difference between a power line VDD 53a applying high potential and a power line VSS 53b applying low potential is maintained at a constant.

The power line VDD 53a providing high potential for the external power source IC 55a is connected to a power line VDDG1 (51) via an inductor 53c, an inductor 53e, and a resistor 53f. In addition, the VDD 53a providing high potential is connected to a VDD 52a via an inductor 53g and resistor 53h. A stability capacitor 53d is connected between the power line VDD 53a and power line VSS 53b.

The LSI 50a is configured of the inductor 53e, resistor 53f, power line VDDG1 (51) providing high potential, inductor 53g, resistor 53h, power line VDD 52a providing high potential, inductor 53i, resistor 53j, power line VSS 54 providing low potential, PMU 56a, gating transistor 58a, gating transistor 59a, gating transistor 63a, gating transistor 63b, stability capacitor C1 (62), stability capacitor C2 (64), power line VDDM 1 (61) providing high potential, power line VDDM 2 (66) providing high potential, circuit A 60, circuit B 65, and PMU 56a. In addition, the LSI 50 has a node G22 (57d), node G21 (57b), node G12 (57c), and node G11 (57a). The inductors 53e, 53g, and 53i are configured of coils formed of wiring.

The circuit A 60 and circuit B 65 are internal circuits within the LSI 50a. The circuit A 60 is connected to the power line VDDM1 (61) and the power line VSS 54 providing low potential (grounding potential).

The stability capacitor C1 (62) is connected between the power line VDDM1 (61) and the power line VSS 54 providing low potential. The stability capacitor C1 (62) serves to stabilize the potential of the circuit A 60. The circuit B 65 is connected to the VDDM2 (66) and the power line VSS 54 providing low potential (grounding potential).

The stability capacitor C2 (64) is connected between the VDDM2 (66) and the power line VSS 54 providing low potential (grounding potential). The stability capacitor C2 (64) serves to stabilize the potential of the circuit B 65.

The power line VDDM1 (61) is connected to the drain of the gating transistor 58a, and is connected via the gating transistor 58a to the power line VDDG1 (51) providing high potential. In addition, the power line VDDM1 (61) is connected to the drain of the gating transistor 59a, and is connected via the gating transistor 59a to the power line VDD 13 providing high potential.

The power line VDDM2 (66) is connected to the drain of the gating transistor 63a, and is connected via the gating transistor 63a to the power line VDDG1 (51) providing high potential. In addition, the power line VDDM2 (66) is connected to the drain of the gating transistor 63b, and is connected via the gating transistor 63b to the power line VDD 13 providing high potential.

The gate electrode of the gating transistor 58*a* is connected to the node G11 (57*a*). The gate electrode of the gating transistor 59*a* is connected to the node G21 (57*b*). Accordingly, controlling the potential of the node G11 (57*a*) or the node G21 (57*b*) controls connection/disconnection of the VDDM1 (61) of the circuit A 60 as to the power line VDDG1 (51) or VDD 13 providing high potential The gate electrode of the gating transistor 63*a* is connected to the node G21 (57*c*). The gate electrode of the gating transistor 63*b* is connected to the node G22 (57*d*). Accordingly, controlling the potential of the node G12 (57*c*) or the node G22 (57*d*) controls connection/disconnection of the VDDM2 (66) of the circuit B 65 as to the power line VDDG1 (51) or VDD 52 providing high potential.

Note that the gating transistor 58*a*, the gating transistor 59*a*, the gating transistor 63*a*, and the gating transistor 63*b* are configured of p-type transistors in the present embodiment. This is because in the case of supplying high potential to the circuit A 60 or circuit B 65 via the p-type transistor, the high potential is transmitted without change to the circuit A 60 or circuit B 65, and the high potential is uninfluenced by a threshold of the p-type transistor.

As described later, the PMU 56*a* includes a CPU 56*a*-1, and outputs signals to the nodes G11 (57*a*), G21 (57*b*), G12 (57*c*), and G22 (57*d*), in accordance with signals from the CPU 56*a*-1. The PMU 56*a* connects to the power line VDD 52*a* providing high potential and the power line VSS 54 providing low potential. A circuit example of the PMU 56*a* will be described later with reference to FIG. 7B.

Accordingly, the PMU 56*a* controls the potential of the nodes G11 (57*a*), G21 (57*b*), G12 (57*c*), and G22 (57*d*), and thereby controls connection/disconnection of the VDDM1 (61) of the circuit A 60 as to the power line VDDG1 (51) or VDD 52 providing high potential. In the same way, the PMU 56*a* controls connection/disconnection of the VDDM2 (66) of the circuit B 65 as to the power line VDDG1 (51) or VDD 52 providing high potential.

The power line VDDG1 (51) is connected to the VDD 53*a* providing high potential via the inductor 53*c*, through an external terminal of the LSI 50*a* via the inductor 53*e* and resistor 53*f*.

In order to provide high potential to the circuit A 60, the VDD 52 providing high potential is connected to the power line VDDM1 (61) of the internal circuit though the gating transistor 59*a*, following connection/disconnection of the VDDM1 (61) and the power line VDDG1 (51).

In order to provide high potential to the circuit B 65, the VDD 52 providing high potential is connected to the power line VDDM2 (66) of the internal circuit though the gating transistor 63*b*, following connection/disconnection of the VDDM2 (62) and the power line VDDG1 (51).

Note that the power line VDD 52 is connected to the VDD 53*a* providing high potential, through an external terminal of the LSI 50*a*, via the inductor 53*g* and resistor 53*h*.

The power line VSS 54 providing low potential (grounding potential) is connected to the VDD 53*b* providing ground potential, through an external terminal of the LSI 50*a*, via the inductor 53*i* and resistor 53*j*.

FIG. 6B is a diagram illustrating potential waveforms at each of the internal nodes, accompanying the operations of the LSI 50*a*. That is to say, FIG. 6B illustrates a waveform 70 of the power line VDD 52, a waveform 71 of the power line VDDG1 (51), a waveform 72 of the node G11 (57*a*), a waveform 74 of the node G21 (57*b*), a waveform 75 of the node G12 (57*c*), a waveform 73 of the power line VDDM1 (61) to connect to the internal circuit A 60 of the LSI 50*a*, and a waveform 76 of the power line VDDM2 (66) to connect to the internal circuit B 65 of the LSI 50*a*.

According to the waveform 70 of the power line VDD 52, the potential of the power line VDD 52 is maintained at a fairly high potential. As described later, from the point-in-time T1 to the point-in-time T4, the power line VDDG1 (51) and the power line VDDM1 (61) are connected. However, from point-in-time T4 on, the power line VDDG1 (51) and the power line VDDM1 (61) are disconnected. Accordingly, power noise generated at the power line VDDG1 (51) is not transmitted to the power line VDDM1 (61). In addition, from point-in-time T4 on, when the power line VDD 52 connects to the power line VDDM1 (61) of the circuit A 60, the power noise of the power line VDDG1 (51) has subsided, so there is no transmission of power noise of the power line VDDG1 (51) to the power line VDD 52 via the power line VDDM1 (61).

In the same way, from the point-in-time T5 to the point-in-time T8, the power line VDDG1 (51) and the power line VDDM2 (66) are connected, but from point-in-time T8 on, so the power line VDDG1 (51) and the power line VDDM2 (66) are not connected. Accordingly, power noise generated at the power line VDDG1 (51) is not transmitted to the power line VDDM2 (66). In addition, from point-in-time T8 on, when the power line VDD 52 connects to the power line VDDM2 (66) of the circuit B 65, the power noise of the power line VDDG1 (51) has subsided, so there is no transmission of power noise of the power line VDDG1 (51) to the power line VDD 52 via the power line VDDM2 (66).

According to the waveform 71 of the power line VDDG1 (51), fluctuation of potential having high frequency components, i.e. so called power noise, appears in the power line VDDG1 (51) immediately after the power line VDDG1 (51) is connected to the power line VDDM1 (61) with the gating transistor 58*a* at point-in-time T1. After this, the fluctuation of potential (power noise) converges at the power line VDDG1 (51), and a constant high potential is maintained.

In the same way, fluctuation of potential having high frequency components, i.e. so called power noise, appears in the power line VDDG1 (51) immediately after the power line VDDG1 (51) is connected to the power line VDDM2 (66) by the gating transistor 63*a* at point-in-time T1. After this, the fluctuation of potential (power noise) converges at the power line VDDG1 (51), and a constant high potential is maintained.

According to the waveform 72 of the node G11 (57*a*), the node G11 (57*a*) indicates the logical level "H" having high potential from the power line VDD 52, but thereafter, the gating transistor 58*a* is turned on at point-in-time T1, whereby the node G11 (57*a*) indicates the logical level "L" having low potential from the power line VSS 54. Further, thereafter, the gating transistor 58*a* is turned off at point-in-time T4, whereby the node G11 (57*a*) again indicates the logical level "H", having the high potential from the power line VDD 52.

Consequently, as the waveform 73 of the power line VDDM1 (61) indicates, the potential of the power line VDDM1 (61) which is connected to the circuit A 60 begins to increase, and at point-in-time T3 the voltage is restored to around the point of potential supplied by the power line VDDG1 (51). Thereafter, when the gating transistor 58*a* is turned off at point-in-time and the gating transistor 59*a* is turned on at T4, the potential of the power line VDDM1 (61) is the potential which the power line VDD 52 supplies, and subsequently, this potential is maintained.

According to the waveform 74 of the node G21 (57*b*), the node G21 (57*b*) indicates the logical level "H" having high potential indicated by the power line VDD 52 before pointin-time T3, and thereafter the gating transistor 59a is turned on at point-in-time T3, whereby the node G21 (57b) indicates the logical level "L" having low potential supplied from the power line VSS 54.

According to the waveform 75 of the node G12 (57c), the node G12 (57c) indicates the logical level "H" having high potential from the power line VDD 52 before point-in-time T5, and thereafter the gating transistor 63a is turned on at point-in-time T5, whereby the node G12 (57c) indicates the logical level "L" having low potential supplied from the power line VSS 54. Moreover, subsequently, the gating transistor 63a is turned off at point-in-time T8, the node G12 (57c) indicates the logical level "H" having high potential from the power line VDD 52 again.

Consequently, as the waveform 76 of the power line VDDM2 (66) indicates, the potential of the power line VDDM2 (66) which is connected to the circuit B 65 begins to increase, and the voltage is restored to the point of potential supplied by the power line VDDG1 (51). Thereafter, when the gating transistor 63a is turned off at point-in-time and the gating transistor 63b is turned on at T8, the potential of the power line VDDM2 (66) is the potential which the power line VDD 52 supplies, and subsequently, this potential is maintained.

Note that before the point-in-time T8, the node G22 (57d) indicates the logical level "H" having high potential from the power line VDD 52, but thereafter, the gating transistor 63b is turned on at point-in-time T8, whereby the node G22 (57d) indicates the logical level "L" having low potential from the power line VSS 54.

Thus, the LSI 50a according to the fifth embodiment has a power line VDDG1 (51), power line VDD 52, power line VDDM1 (61), and power line VDDM2 (66). In addition, the LSI 50a according to the fifth embodiment has a gating transistor 58a to connect/disconnect the power line VDDG1 (51) and the power line VDDM1 (61), and a gating transistor 59a to connect/disconnect the power line VDD 52 and the power line VDDM1 (61). In addition, the LSI 50a according to the fifth embodiment has a gating transistor 63a to connect/disconnect the power line VDDG1 (51) and the power line VDDM2 (66), and a gating transistor 63b to connect/disconnect the power line VDD 52 and the power line VDDM2 (66).

In addition, with the PMU 56a according to the fifth embodiment, the gating transistor 58a drives the G11 (57a) so as to connect the power line VDDG1 (51) and the power line VDDM1 (61), and thereafter, the gating transistor 59a drives the G21 (57b) so as to connect the power line VDD 52 and power line VDDM1 (61), and has voltage supplied from the power line VDD 52. Note that the PMU 56a drives the G12 (57c) such that the gating transistor 63a connects the power line VDDG1 (51) and the power line VDDM2 (66), and subsequently drives the G12 (57c) so as to disconnect these, an in addition drives the G22 (57d) such that the gating transistor 63b connects the power line VDD 52 and the power line VDDM2 (66).

The circuit A 60 and circuit B 65 which are subjected to power on/off control are connected to the power line VDDM1 (61) and the power line VDDM2 (66), and the PMU 6a which constantly has the power turned on is connected to the power line VDD 52.

With the LSI 50a, in the event that power is turned on as to the circuit A 60, power noise occurs only at the power line VDDG1 (51), and the above-mentioned noise is not propagated to the power line VDD 52 via the power line VDDM1 (61) or the power line VDDM2 (66).

Consequently, there is the advantage that the above-mentioned power noise does not influence the circuit within the PMU 6a having a stable operation or constant operation.

In addition, even in the event that the potential of the circuit B 65 rises while the circuit A 60 is operating, noise is not propagated to the circuit A 60, and the circuit A 60 operates in a stable manner.

With the semiconductor device according to the fifth embodiment, current is supplied suddenly from the power line VDDG1 (51) to the power line VDDM1 (61) and power line VDDM2 (66), and the restoring time for the voltage of the power line VDDM1 (61) and power line VDDM2 (66) is shortened.

Note that with the above, description has been made wherein the circuit A 60 and the circuit B 65 exist as internal circuits of the LSI 50a. However, other circuits to be subjected to power-gating, such as a circuit C, circuit D, and so on, may be provided therein, besides the circuit A 60 and circuit B 65. In this case, it is needless to say that power lines (VDDMn (wherein n is an integer of 3 or greater)) are provided to connected individually to the circuits C and so on, and that the power lines (VDDMn (wherein n is an integer of 3 or greater)) perform disconnection/connection of the power line VDDG1 (51) and power line VDD 52 with gating transistors. In addition, it is needless to say that the gate electrodes of the gating transistors connect to the driving line connected to the PMU 56a.

Note that with the above, description has been made wherein the period in which power is supplied from the power line VDDG1 (51) to the circuit A 60 and the period in which power is supplied from the power line VDDG1 (51) to the circuit B 65 do not overlap. However, the above periods for supplying power may overlap. The reason is as follows. First, the power noise of the power line VDDG1 (51) which has been generated to raise the voltage of the circuit A 60 propagates to the circuit B 65. This is because the power line VDDM1 (61) and the power line VDDM2 (66) are connected to the power line VDDG1 (51) at the same time. However, the voltage is rising at the circuit B 65 as well, and accordingly the circuit B 65 is not performing normal operations.

Figure 7B:
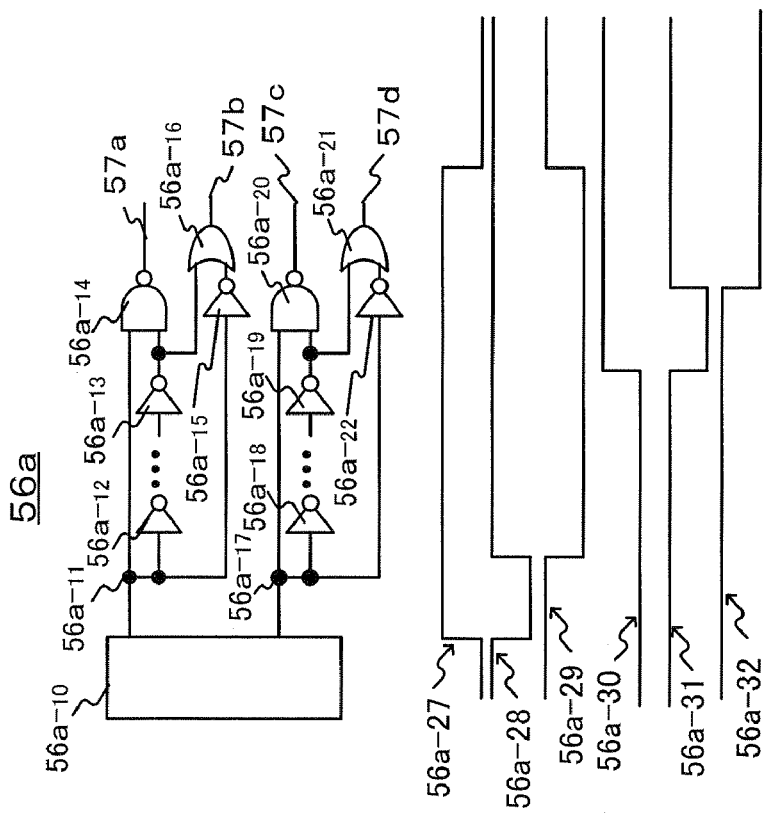
FIGS. 7A and 7B illustrate a first circuit example and second circuit example of a PMU 56a of a semiconductor device according to a fifth embodiment.
Figure 7A:
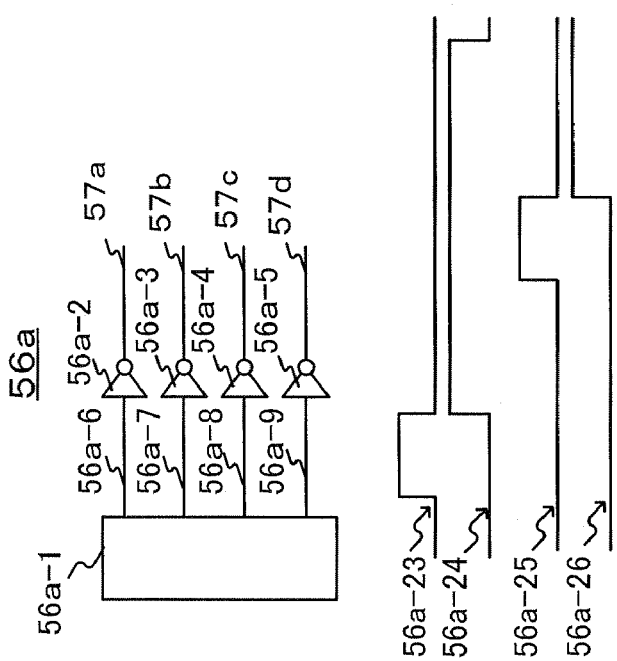

FIGS. 7A and 7B illustrate a first circuit example and second circuit example of the PMU 56a of the semiconductor device according to the fifth embodiment. FIG. 7A illustrates the first circuit example of the PMU 56a and waveforms of the signal lines. The first circuit example of the PMU 56a includes a CPU 56a-1, inverter 56a-2, inverter 56a-3, inverter 56a-4, and inverter 56a-5. The PMU 56a in addition includes a signal line 56a-6, signal line 56a-7, signal line 56a-8, and signal line 56a-9. The changes in signals on the signal line 56a-6, signal line 56a-7, signal line 56a-8, and signal line 56a-9, are shown by the waveform 56a-23, waveform 56a-24, waveform 56a-25, and waveform 56a-26, respectively.

The CPU 56a-1 manages the operations of the circuit A 60 and the circuit B 65, and determines the periods in which power should be supplied to the circuit A 60 and the circuit B 65. The CPU 56a-1 outputs code signals to the signal line 56a-6, signal line 56a-7, signal line 56a-8, and signal line 56a-9, in accordance with the determination made thereby. Note that the code signals output to the signal line 56a-6, signal line 56a-7, signal line 56a-8, and signal line 56a-9, are pulse signals which normally indicate a logical level "L", according to the waveform 56a-23, waveform 56a-24, waveform 56a-25, and waveform 56a-26, but indicate a logical level "H" upon selecting gating transistors 58a, 59a, 63a, and 63b to connect to.

Note that when the gating transistor 59a is going to be turned on, the gating transistor 58a will be turned off, so a pulse period of a code signal is set for outputting to the signal line 56a-7 following ending of the pulse period of the code signal to be output to the signal line 56a-6, as shown by waveform 56a-23 and waveform 56a-24. In the same way, that when the gating transistor 63a is going to be turned on, the gating transistor 63b will be turned off, so a pulse period of a code signal is set for outputting to the signal line 56a-9 following ending of the pulse period of the code signal to be output to the signal line 56a-8, as shown by waveform 56a-25 and waveform 56a-26.

The input terminal of the inverter 56a-2 is connected to the signal line 56a-6, the input terminal of the inverter 56a-3 is connected to the signal line 56a-7, the input terminal of the inverter 56a-4 is connected to the signal line 56a-8, and the input terminal of the inverter 56a-5 is connected to the signal line 56a-9.

The output terminal of the inverter 56a-2 is connected to the node G11 (57a), the output terminal of the inverter 56a-3 is connected to the node G21 (57b), the output terminal of the inverter 56a-4 is connected to the node G12 (57c), and the output terminal of the inverter 56a-5 is connected to the node G22 (57d). Note that the node G11 (57a), node G21 (57b), node G12 (57c), and node G22 (57d) normally indicate a logical level "H", but a logical level "L" signal is output upon selecting gating transistors. In addition note that the logical level "H" potential level here is the potential level of the power line VDD 52.

Accordingly, on/off of the gate transistor 58a, gate transistor 59a, gate transistor 63a, and gate transistor 63b, is controlled by code signals from the CPU 56a-1.

FIG. 7B illustrates the second circuit example of the PMU 56a and waveforms of the signal lines. The second circuit example of the PMU 56a includes a CPU 56a-10, inverter 56a-12, inverter 56a-13, inverter 56a-15, NAND 56a-14, OR 56a-16, inverter 56a-18, inverter 56a-19, inverter 56a-19, inverter 56a-22, NAND 56a-20, and OR 56a-21. The PMU 56a according to the second circuit example in addition includes a signal line 56a-11 and signal line 56a-17. The changes in signals at the signal line 56a-11, G11 (57a), G21 (57b), signal line 56a-11, G12 (57c), and G22 (57d), are shown by the waveform 56a-27, waveform 56a-28, waveform 56a-29, waveform 56a-30, waveform 56a-31, and waveform 56a-32, respectively.

The CPU 56a-10 manages the operations of the circuit A 60 and the circuit B 65, and determines the periods in which power should be supplied to the circuit A 60 and the circuit B 65. The CPU 56a-10 outputs code signals to the signal line 56a-11 and signal line 56a-17 in accordance with the determination made thereby. Note that the code signals output to the signal line 56a-11 are pulse signals which normally indicate a logical level "L", according to the waveform 56a-27, but indicate a logical level "H" upon selecting gating transistors 58a and 59a. In addition, the code signals output to the signal line 56a-17 are pulse signals which normally indicate a logical level "L", according to the waveform 56a-30, but indicate a logical level "H" upon selecting gating transistors 63a and 63b.

The odd-numbered inverter row including the inverter 56a-12 and inverter 56a-13 receives code signals on the signal line 56a-11, and outputs delay code signals of the above-described code signals at one input terminal of the NAND 56a-14.

The NAND 56a-14 receives code signals on the signal line 56a-11 at the other input terminal thereof, and receives the above delay code signals at the one input terminal thereof. The NAND 56a-14 then outputs signals to the node G11 (57a). The result is that, as shown by waveform 56a-28, signals output to the node G11 (57a) are pulse signals which normally indicate a logical level "H", but indicate a logical level "L" for a certain period from the rising of the code signal at the signal line 56a-11.

The odd-numbered inverter row including the inverter 56a-18 and inverter 56a-19 receives code signals on the signal line 56a-17, and outputs delay code signals of the above-described code signals at one input terminal of the NAND 56a-20.

The NAND 56a-20 receives code signals on the signal line 56a-17 at the other input terminal thereof, and receives the above delay code signals at the one input terminal thereof. The NAND 56a-20 then outputs signals to the node G12 (57c). The result is that, as shown by waveform 56a-31, signals output to the node G11 (57c) are pulse signals which normally indicate a logical level "H", but indicate a logical level "L" for a certain period from the rising of the code signal at the signal line 56a-17.

In addition, the OR 56a-16 receives the output from the inverter 56a-15 receiving the code signals on the signal line 56a-11, at the other input terminal thereof. The OR 56a-16 receives the output from the odd-numbered inverter row including the inverter 56a-12 and inverter 56a-13 receiving the code signals on the signal line 56a-11, at the one input terminal thereof. The OR 56a-16 outputs signals to the node G21 (57b).

As indicated by waveform 56a-29, signals output to the node G21 (57b) are pulse signals which normally indicate a logical level "H", but indicate a logical level "L" for a certain period from the rising of the code signal at G11 (57a).

In addition, the OR 56a-21 receives the output from the inverter 56a-22 receiving the code signals on the signal line 56a-17, at the other input terminal thereof. The OR 56a-21 receives the output from the odd-numbered inverter row including the inverter 56a-18 and inverter 56a-19 receiving the code signals on the signal line 56a-17, at the one input terminal thereof. The OR 56a-21 outputs signals to the node G22 (57d).

As indicated by waveform 56a-32, signals output to the node G22 (57d) are pulse signals which normally indicate a logical level "H", but indicate a logical level "L" for a certain period from the rising of the code signal at G12 (57c).

Note that when the gating transistor 59a is going to be turned on, the gating transistor 58a will be turned off, so a pulse period of a code signal is set for outputting to the node G21 (57b) following ending of the pulse period of the code signal to be output to the node G11 (57a), as shown by waveform 56a-28 and waveform 56a-29. In the same way, that when the gating transistor 63a is going to be turned on, the gating transistor 63b will be turned off, so a pulse period of a code signal is set for outputting to the node G22 (57d) following ending of the pulse period of the code signal to be output to the node G12 (57c), as shown by waveform 56a-31 and waveform 56a-32.

Accordingly, on/off of the gate transistor 58a, gate transistor 59a, gate transistor 63a, and gate transistor 63b, is controlled by code signals from the CPU 56a-10 shown in FIG. 7B.

FIG. 8A illustrates a modification example (LSI 50b) of the semiconductor device according to the fifth embodiment, and FIGS. 8B and 8C illustrate a first circuit example and second circuit example of the PMU 56b of the modification example thereof. The semiconductor device (LSI 50b) differs from the semiconductor device (LSI 50a) according to the fifth embodiment in that the gating transistor 58b and the gating transistor 59b supplying power to the power line VDDM1 (61) are n-type transistors, and in that the gating transistor 63c and the gating transistor 63d supplying power to the power line VDDM2 (66) are n-type transistors, and further in that the configuration of the PMU 56b controlling the gating transistors 58a, 59b, 63c, and 63d, and the logic of the signals output from the PMU 56b to the nodes G11 (57e), G21 (57f), G12 (57g), and G22 (57h). This point will be described in detail later. The semiconductor device (LSI 50b) in addition differs from the semiconductor device (LSI 50a) according to the fifth embodiment in having a terminal for accepting high potential of a different potential, and having a power line VDD 53p connected to this terminal via an inductor 53k and resistor 53i. However, it should be noted that the semiconductor device (LSI 50b) is the same as the semiconductor device (LSI 50a) regarding other configurations, such as the power line VDDG1 (51), power line VDD 52, and so on, and the internal circuits (circuit A 60, etc.). Accordingly, components which are the same are denoted with the same reference numerals in FIG. 8A, and description of components with the same reference numerals will be omitted from the following description.

An external power source IC 55b supplies normal high potential via the power line VDD 53a. In addition, the external power source IC 55b supplies high potential which is higher than the high potential supplied by the power line VDD 53a by an amount equal to or greater than the threshold value of the gating transistor 58b, gating transistor 59b, gating transistor 63c, and gating transistor 63d, via the power line VDD 53o. Note that the external power source IC 55b is a normal DC/DC converter.

The power line VDD 53a connects to the power terminal to which the power line VDDG1 (51) of the LSI 50b connects to, via the inductor 53c. In addition, the power line VDD 53a connects to the power source terminal to which the power line VDD 52 of the LSI 50b connects to. Note that the power line VDD 53a and the VSS 53b are connected by a capacitor 53m for stabilization of voltage. The power line VDD 53o connects to a power terminal which the power line VDD 53p of the LSI 50b connects to. In addition, the power line VDD 53o and the VSS 53b are connected by a capacitor 53n for stabilization of voltage.

The PMU 56b outputs signals, fluctuating between the high potential supplied from the power line VDD 53p and the low potential supplied by the power line VSS 54, to the nodes G11 (57e), G21 (57f), G12 (57g), and G22 (57h). In addition, the power line VDD 53p is supplied with high potential which is higher than the high potential supplied to the power line VDD 52 and power line VDDG1 (51) by an amount equal to or greater than the threshold value of the gating transistor 58b, gating transistor 59b, gating transistor 63c, and gating transistor 63d.

The nodes G11 (57e), G21 (57f), G12 (57g), and G22 (57h), are connected to the gating transistor 58b, gating transistor 59b, gating transistor 63c, and gating transistor 63d, respectively. Accordingly, on/off control of the gating transistor 58b, gating transistor 59b, gating transistor 63c, and gating transistor 63d is controlled by signals output from the PMU 53d to the nodes G11 (57e), G21 (57f), G12 (57g), and G22 (57h). Detailed examples of the PMU 56b will be described later with reference to FIGS. 8B and 8C.

Now, the gating transistor 58b, gating transistor 59b, gating transistor 63c, and gating transistor 63d are n-type transistors, This means that, when voltage which is higher than the potential supplied to the power line VDD 52 and power line VDDG1 (51) as described above is supplied to each of the gate electrodes, the gating transistor 58b, gating transistor 59b, gating transistor 63c, and gating transistor 63d supply the potential to be supplied to the power line VDD 52 or power line VDDG1 (51), without change, to the power line VDDM1 (61) or power line VDDM2 (66).

Note that the circuit A 60 and circuit B 65 regarding which on/off of power is controlled, are connected to the power line VDDM1 (61) and the power line VDDM2 (66), and the power line VDD 52 is connected to the PMU 6b which is always on.

Accordingly, the LSI 50b operates in the same manner as the LSI 50a. The gating transistor 58b, gating transistor 59b, gating transistor 63c, and gating transistor 63d, operate in the same manner as the gating transistor 58a, gating transistor 59a, gating transistor 63a, and gating transistor 63b of the LSI 50a.

With the LSI 50b, in the event that power is turned on as to the circuit A 60 and circuit B 65, power noise occurs only at the power line VDDG1 (51), and the above-mentioned noise is not propagated to the power line VDD 52 via the power line VDDM1 (61) or VDDM2 (66).

Consequently, there is the advantage that the above-mentioned power noise does not influence the circuit within the PMU 6b having a stable operation or constant operation.

In addition, even in the event that the potential of the circuit B 65 rises while the circuit A 60 is operating, noise is not propagated to the circuit A 60, and the circuit A 60 operates in a stable manner.

FIG. 8B illustrates the first circuit example of the PMU 56b and waveforms of the signal lines. The first circuit example of the PMU 56b includes a CPU 56b-1, amplifier 56b-2, amplifier 56b-3, amplifier 56b-4, and amplifier 56b-5. The PMU 56b in addition includes a signal line 56b-6, signal line 56b-7, signal line 56b-8, and signal line 56b-9. The changes in signals on the signal line 56b-6, signal line 56b-7, signal line 56b-8, and signal line 56b-9, are shown by the waveform 56b-23, waveform 56b-24, waveform 56b-25, and waveform 56b-26, respectively.

The CPU 56b-1 operates in the same manner as the CPU 56a-1. The CPU 56b-1 outputs code signals to the signal line 56b-6, signal line 56b-7, signal line 56b-8, and signal line 56b-9, in accordance with the determination made thereby. Note that the code signals output to the signal line 56b-6, signal line 56b-7, signal line 56b-8, and signal line 56b-9, are pulse signals which normally indicate a logical level "L", according to the waveform 56b-23, waveform 56b-24, waveform 56b-25, and waveform 56b-26, but indicate a logical level "H" when selecting gating transistors 58b, 59b, 63c, and 63d to connect to.

Note that when the gating transistor 59b is going to be turned on, the gating transistor 58b will be turned off, so a pulse period of a code signal is set for outputting to the signal line 56b-7 following ending of the pulse period of the code signal to be output to the signal line 56b-6, as shown by waveform 56b-23 and waveform 56b-24. In the same way, that when the gating transistor 63c is going to be turned on, the gating transistor 63d will be turned off, so a pulse period of a code signal is set for outputting to the signal line 56b-9 following ending of the pulse period of the code signal to be output to the signal line 56b-8, as shown by waveform 56b-25 and waveform 56b-26.

The input terminal of the amplifier 56b-2 is connected to the signal line 56b-6, the input terminal of the amplifier 56b-3 is connected to the signal line 56b-7, the input terminal of the amplifier 56b-4 is connected to the signal line 56b-8, and the input terminal of the amplifier 56b-5 is connected to the signal line 56b-9.

The output terminal of the amplifier 56b-2 is connected to the node G11 (57a), the output terminal of the amplifier 56b-3 is connected to the node G21 (57b), the output terminal of the amplifier 56b-4 is connected to the node G12 (57c), and the output terminal of the amplifier 56b-5 is connected to the node G21 (57d). Note that the node G11 (57a), node G21 (57b), node G12 (57c), and node G22 (57d) normally indicate a logical level "L", but a logical level "H" signal is output upon selecting gating transistors. In addition note that the logical level "H" potential level here is the potential level of the power line VDD 53p.

Accordingly, on/off of the gate transistor 59a, gate transistor 59a, gate transistor 63a, and gate transistor 63b, is controlled by code signals from the CPU 56b-1.

FIG. 8C illustrates the second circuit example of the PMU 56b and waveforms of the signal lines. The second circuit example of the PMU 56b includes a CPU 56b-10, inverter 56b-12, inverter 56b-13, inverter 56b-15, AND 56b-14, NOR 56b-16, inverter 56b-18, inverter 56b-19, inverter 56b-19, inverter 56b-22, AND 56b-20, and NOR 56b-21. The PMU 56b according to the second circuit example in addition includes a signal line 56b-11 and signal line 56b-17. The changes in signals at the signal line 56b-11, G11 (57a), G21 (57b), signal line 56b-11, G12 (57c), and G22 (57d), are shown by the waveform 56b-27, waveform 56b-28, waveform 56b-29, waveform 56b-30, waveform 56b-31, and waveform 56b-32, respectively.

The CPU 56b-10 operates in the same manner as the CPU 56a-1. The CPU 56b-10 outputs code signals to the signal line 56b-11 and signal line 56b-17 in accordance with the determination made thereby. Note that the code signals output to the signal line 56b-11 are pulse signals which normally indicate a logical level "L", according to the waveform 56b-27, but indicate a logical level "H" upon selecting gating transistors 58b and 59b. In addition, the code signals output to the signal line 56b-17 are pulse signals which normally indicate a logical level "L", according to the waveform 56b-30, but indicate a logical level "H" upon selecting gating transistors 63c and 63d.

The odd-numbered inverter row including the inverter 56a-12 and inverter 56a-13 receives code signals on the signal line 56a-11, and outputs delay code signals of the above-described code signals at one input terminal of the AND 56a-14.

The AND 56a-14 receives code signals on the signal line 56a-11 at the other input terminal thereof, and receives the above delay code signals at the one input terminal thereof. The AND 56a-14 then outputs signals to the node G11 (57a). The result is that, as shown by waveform 56a-28, signals output to the node G11 (57a) are pulse signals which normally indicate a logical level "L", but indicate a logical level "H" for a certain period from the rising of the code signal at the signal line 56a-11.

The odd-numbered inverter row including the inverter 56a-18 and inverter 56a-19 receives code signals on the signal line 56a-17, and outputs delay code signals of the above-described code signals at one input terminal of the AND 56a-20.

The AND 56a-20 receives code signals on the signal line 56a-17 at the other input terminal thereof, and receives the above delay code signals at the one input terminal thereof. The AND 56a-20 then outputs signals to the node G12 (57c). The result is that, as shown by waveform 56a-31, signals output to the node G12 (57c) are pulse signals which normally indicate a logical level "H", but indicate a logical level "L" for a certain period from the rising of the code signal at the signal line 56a-17.

In addition, the NOR 56a-16 receives the output from the inverter 56a-15 receiving the code signals on the signal line 56a-11, at the other input terminal thereof. The NOR 56a-16 receives the output from the odd-numbered inverter row including the inverter 56a-12 and inverter 56a-13 receiving the code signals on the signal line 56a-11, at the one input terminal thereof. The NOR 56b-16 outputs signals to the node G21 (57b).

As indicated by waveform 56a-29, signals output to the node G21 (57b) are pulse signals which normally indicate a logical level "L", but indicate a logical level "H" for a certain period from the rising of the code signal at G11 (57a).

In addition, the NOR 56a-21 receives the output from the inverter 56a-22 receiving the code signals on the signal line 56a-17, at the other input terminal thereof. The NOR 56a-21 receives the output from the odd-numbered inverter row including the inverter 56a-18 and inverter 56a-19 receiving the code signals on the signal line 56a-17, at the one input terminal thereof. The NOR 56b-21 outputs signals to the node G22 (57d).

As indicated by waveform 56a-32, signals output to the node G22 (57d) are pulse signals which normally indicate a logical level "L", but indicate a logical level "H" for a certain period from the rising of the code signal at G12 (57c).

Note that when the gating transistor 59b is going to be turned on, the gating transistor 58b will be turned off, so a pulse period of a code signal is set for outputting to the node G21 (57b) following ending of the pulse period of the code signal to be output to the node G11 (57a), as shown by waveform 56b-28 and waveform 56b-29. In the same way, that when the gating transistor 63c is going to be turned on, the gating transistor 63d will be turned off, so a pulse period of a code signal is set for outputting to the node G22 (57d) following ending of the pulse period of the code signal to be output to the node G12 (57c), as shown by waveform 56b-31 and waveform 56b-32.

Accordingly, on/off of the gate transistor 58b, gate transistor 59b, gate transistor 63c, and gate transistor 63d, is controlled by code signals from the CPU 56b-10 shown in FIG. 8C.

Sixth Embodiment

The sixth embodiment relates to a semiconductor device having a first power line (VDDG1 (1b)) and second power line (VDD 13) wherein a constant voltage is constantly maintained, a third power line (VDDM 74) of an internal circuit connected to the second power line after being connected to the first power line, a first switch to connect/disconnect the first power line and third power line, a second switch to connect/disconnect the second power line and third power line, and a control circuit to control the on/off of the first and second switches and the sequence of the on/off thereof. The semiconductor device (LSI 70) according to the sixth embodiment differs from the semiconductor device according to the second embodiment (LSI 15B) in that the control circuit determines the on/off period of the first and second switches according to the potential of the third power line (VDDM 74).

FIG. 9A is a diagram illustrating a semiconductor device (LSI 70) according to the sixth embodiment, and FIG. 9B illustrates potential waveforms at each of the nodes, accompanying the operation thereof. FIG. 9A illustrates a circuit diagram of the semiconductor device (LSI 70) according to the sixth embodiment.

The LSI 70 differs in comparison with the LSI 15B (configured of the LSI 15A, inductor 17b, and capacitor 17c) in the configuration of the PMU 71a, and in including a control circuit 79 for controlling on/off of the gating transistor 8 and gating transistor 9 in accordance with signals output form the PMU 71a and the potential of the power line VDDM 74.

The PMU 71*a* receives the code signal 71*b* from the CPU 12*b*, performs inverse amplification of the code signal 71*b* at the inverter 71*c* within the PMU 71*a*, and outputs to the node G1 (72). Note that the signals output to the node G1 (72) are pulse signals which normally indicate a logical level "H", but indicate a logical level "L" at the time of the gating transistor 8 going on.

The control circuit 79 is configured of an n-type MOS transistor 77*b* which receives the node G1 (77) at the source thereof, with the drain connected to the gate electrode of a gating transistor and the gate electrode connected to the node G2 (73), a p-type MOS transistor 77*c* with the source thereof connected to the power line VDD 13, the drain connected to the drain of the n-type MOS transistor 77*b*, and the gate electrode connected to the node G2 (73), an OR 76 of which one input terminal connects to the node G1 (77) and the other input terminal connects to the node 75, and the output terminal connects to the node G2 (73), and a level detecting inverter 77*a* which receives the power line VDDM 74 at the input terminal thereof and the output terminal connected to the node 75.

Upon the control circuit 79 receiving a signal from the PMU 71*a* which goes from logical level "H" to logical level "L" via the node G1 (72), the control circuit 79 performs the following operations. First, the signal form the PMU 71*a* is transmitted to the gate electrode of the gating transistor 8 via the n-type MOS transistor 77*b*, and turns on the gating transistor 8, while in addition being input to one input terminal of the OR 76. Next, the power line VDDG1 (1*b*) and the power line VDDM 74 which provides high potential to the circuit A 7 within the LSI 70 are connected, and the potential of the power line VDDM 74 rises.

Next, upon the potential level of the power line VDDM 74 exceeding the threshold value of the level detecting inverter 77*a* of which the input terminal is connected other power line VDDM 74, the level detecting inverter 77*a* outputs a signal for switching logical level "H" to logical level "L" to the node 75. Next, the signal output from the level detecting inverter 77*a* is input to the other input terminal of the OR 76, following which the OR 76 outputs a signal for switching logical level "H" to logical level "L" to the node G2 (73). Note that the OR 76 and the level detecting inverter 77*a* receives supply of power source from the power line VDD 13.

Next, the gating transistor 9 goes on. The gate electrode of the n-type transistor 77*b* and the gate electrode of the p-type transistor 77*c* are connected to the node G2 (73). Upon the signal output from the OR 76 being transmitted to the gate electrode of the n-type transistor 77*b*, the n-type transistor 77*b* goes off, and the p-type transistor 77*c* goes on. Next, the potential level of the power line VDD 13, i.e., potential of the logical level "H" is transmitted to the gate electrode of the gating transistor 8 via the p-type transistor, whereby the gating transistor 8 goes off.

Note however, that the on state of the gating transistor is maintained, so high potential from the power line VDD 13 is supplied to the power line VDDM 74.

Subsequently, upon a signal for switching from logical level "L" to logical level "H" being input to the node G1 (72), the signal is transmitted to the one input terminal of the OR 76, and the node G2 (73) switches from logical level "L" to logical level "H". Consequently, the gating transistor goes off. In addition, the n-type transistor 77*b* turns on, the potential of the node G1 (72) is transmitted to the gate electrode of the gating transistor 8, and the off state of the gating transistor 8 is maintained.

Thus, the control circuit 79 turns the gating transistor 8 on by the signal from the PMU 71*a*, and upon the potential of the power line VDDM 74 reaching the predetermined potential, the gating transistor 8 and the gating transistor 9 are controlled such that the gating transistor 8 goes off and at the same time gating transistor 9 goes on automatically, due to the control functions which the control circuit 79 has.

Note that description has been made above regarding the operations of the control circuit 79, with the gating transistor 8 and the gating transistor 9 being p-type MOS transistors. However, one skilled in the art would be able to configure the control circuit 79 having the same functions even in a case wherein the gating transistor 8 and the gating transistor 9 are p-type MOS transistors. In this case, the high potential is transmitted without change from the power line VDD 13 tot the power line VDDM 74, so it goes without saying that the logical level "H" potential output to the node G1 (72) is desirably a potential higher than the above high potential by an amount equal to or greater than the threshold value of the n-type transistor.

In addition, description has been made above with the gating transistor 8 turning off upon the power line VDDM 74 reaching a predetermined potential, due to the operations of the n-type transistor 77*b* and the p-type transistor 77*c*. However, an arrangement may be made wherein the node G1 (72) is straightforwardly connected to the gate electrode of the gating transistor 8. In this case, the gating transistor 8 performs the same operations as described in FIG. 1.

FIG. 9B is a diagram illustrating potential waveforms at each of the internal nodes, accompanying the operation of the LSI 70. That is to say, FIG. 9B illustrates a waveform 78*a* of the power line VDD 13, a waveform 21 of the power line VDDG1 (1*b*), a waveform 78*b* of the power source line 19*b*, a waveform 78*c* of the node G1 (72), a waveform 78*e* of the node G2 (73), a waveform 78*d* of the power line VDDM 74 to connect the internal circuit A 7 of the LSI 70, and a waveform 78*f* of the gating transistor 8.

According to the waveform 78*a* of the power line VDD 13, the potential of the power line VDD 13 is maintained at a fairly high potential. The reason is that, until the point-in-time T4, the power line VDD 13 and power line VDDM 74 are not connected, whereby the power noise of the later-described power line VDDG1 (1*b*) is not transmitted to power line VDD 13 via the power line VDDM 74. In addition, after point-in-time T4 wherein the power line VDD 13 is connected to the power line VDDM 74 of the circuit A 7, the power noise subsides, and the power noise of the power line VDDG1 (1*b*) is not transmitted to the power line VDD 13 via the power line VDDM 74 of the circuit A 7.

According to the waveform 21 of the power line VDDG1 (1*b*), fluctuation of potential having high frequency components, i.e. so called power noise, appears in the power line VDDG1 (1*b*) immediately after the power line VDDG1 (1*b*) is connected to the power line VDDM 74 with the gating transistor 8 at point-in-time T1. This is because current suddenly flows from the power line VDDG1 (1*b*) as to the power line VDDM 74, whereby the potential of the power line VDDG1 (1*b*) becomes unstable. After this, the fluctuation of potential (power noise) converges at the power line VDDG1 (1*b*), and a constant high potential is maintained.

According to the waveform 78*c* of the node G1 (72), the node G1 (72) indicates the logical level "H" having high potential from the power line VDD 13, but thereafter, the gating transistor 8 is turned on at point-in-time T1, whereby the node G1 (72) indicates the logical level "L" having low potential from the power line VSS 14. Further, thereafter, the gating transistor 8 is turned off at point-in-time T5, whereby the PMU 6*a* outputs a signal indicating the logical level "H"

to the node G1 (72). Note that the gating transistor 8 is turned off by the operations of the control circuit 79, as described later.

According to the waveform 78f of the gate electrode of the gating transistor 8, upon the potential of the node G1 (72) having made transition from the logical level "H" to logical level "L" at point-in-time T1, the potential of the gate electrode goes from logical level "H" to logical level "L". Subsequently, upon the potential of the VDDM 74 exceeding the threshold value of the level detecting inverter 77a, the potential of the node G2 (73) goes from logical level "H" to logical level "L". Consequently, the gating transistor 9 goes on. Next, the n-type MOS transistor 77b of the control circuit 79 goes off, and the p-type MOS transistor 77c goes on, so the potential of the gate electrode of the gating transistor 8 is logical level "H". As a result, the gating transistor 8 goes off.

Consequently, as the waveform 78d of the power line VDDM 74 indicates, the potential of the power line VDDM 74 which is connected to the circuit A 7 begins to increase, and the voltage is restored to the point of potential supplied by the power line VDDG1 (1b). Thereafter, when the gating transistor 9 is turned off at point-in-time T5, the potential of the power line VDDM 74 naturally drops since the circuit A 7 consumes current.

According to the waveform 78e of the node G2 (73), the node G2 (73) indicates the logical level "H" having the high potential which the power line VDD 13 indicates prior to the point-in-time T3. Subsequently, at point-in-time T3, upon the potential of the power line VDD 74 exceeding the threshold value of the inverter 77a, the potential of the node 75 goes to logical level "L", and the OR 76 of the control circuit 79 outputs a signal indicating logical level "L" to the node G2 (73) at point-in-time t4. Subsequently, upon a signal of logical level "H" being input to the one input terminal of the OR 76 from the node G1 (72), the OR 76 outputs a signal indicating logical level "H" to the node G2 (73) at point-in-time t5. The gating transistor goes on in the period between point-in-time T4 to point-in-time T5.

Thus, the LSI 70 according to the sixth embodiment has a power line VDDG1 (1b), power line VDD 13, and power line VDDM 74. In addition, the LSI 70 according to the sixth embodiment has a gating transistor 8 to connect/disconnect the power line VDDG1 (1b) and the power line VDDM 74, and a gating transistor 9 to connect/disconnect the power line VDD 13 and the power line VDDM 74. In addition, the LSI 70 according to the sixth embodiment has a CPU 12b, PMU 71a, and a control circuit 79, to which voltage is supplied from the power line VDD 13, wherein the gating transistor 8 drives the G1 (72) so as to connect the power line VDDG1 (1b) and the power line VDDM 74, and thereafter, the gating transistor 9 drives the G2 (73) so as to connect the power line VDD 13 and power line VDDM 74.

The circuit A 7 which is subjected to power on/off control is connected to the power line VDDM 74, and the circuit B 12a and PMU 6a which constantly have the power turned on are connected to the power line VDD 13.

With the LSI 70, in the event that the power source is turned on as to the circuit A 7, power noise occurs only at the power line VDDG1 (1b), and the above-mentioned noise is not propagated to the power line VDD 13 via the power line VDDM 74.

Consequently, there is the advantage that the above-mentioned power noise does not influence the circuit 12a or the circuit within the PMU 6a having a stable operation or constant operation.

For example, the CPU 12b within the circuit 12a and the clock generating circuit are not influenced by the power noise, whereby stable operations is performed.

Further, as with the LSI 15B, the LSI 70 has the power line VDD 19a of the external power IC 18 and the power line VDDG1 (1b) connected via the LPF 17a, with the power line VDD 19a of the external power IC 18 and the power line VDD 13 connected. Accordingly, the power noise generated at the power line VDDG1 (1b) is not propagated to the power line 13 via the power line VDD 19a of the external power IC 18.

With the semiconductor device according to the sixth embodiment, current is supplied suddenly from the power line VDDG1 (1b) to the VDDM 74, and the restoring time for the voltage of the power line VDDM 74 is shortened.

With the above sixth embodiment, at the time of the VDDM 74 reaching a stable level, the logical level of the gate electrode of the gating transistor 8 goes to "H" due to the n-type MOS transistor 77b and the p-type MOS transistor 77c, but this arrangement is not indispensable. In the event that the n-type MOS transistor 77b and the p-type MOS transistor 77c are not included, the G1 (72) signals directly drive the gating transistor 8. In this case, the waveform 78c will be the same as the waveform 22 in FIG. 1B.

Seventh Embodiment

The seventh embodiment relates to a semiconductor device having a first power line (VDDG1 (82C)) and second power line (VSS 93) wherein a constant voltage is constantly maintained, a third power line (VSSM 90) of an internal circuit connected to the second power line after being connected to the first power line, a first switch to connect/disconnect the first power line and third power line, a second switch to connect/disconnect the second power line and third power line, and a control circuit to control the on/off of the first and second switches and the sequence of the on/off thereof. Note that while the first power line and third power line supply high potential with the first embodiment, the seventh embodiment differs from this in that the first power line and the third power line supply low potential.

Figure 10A:
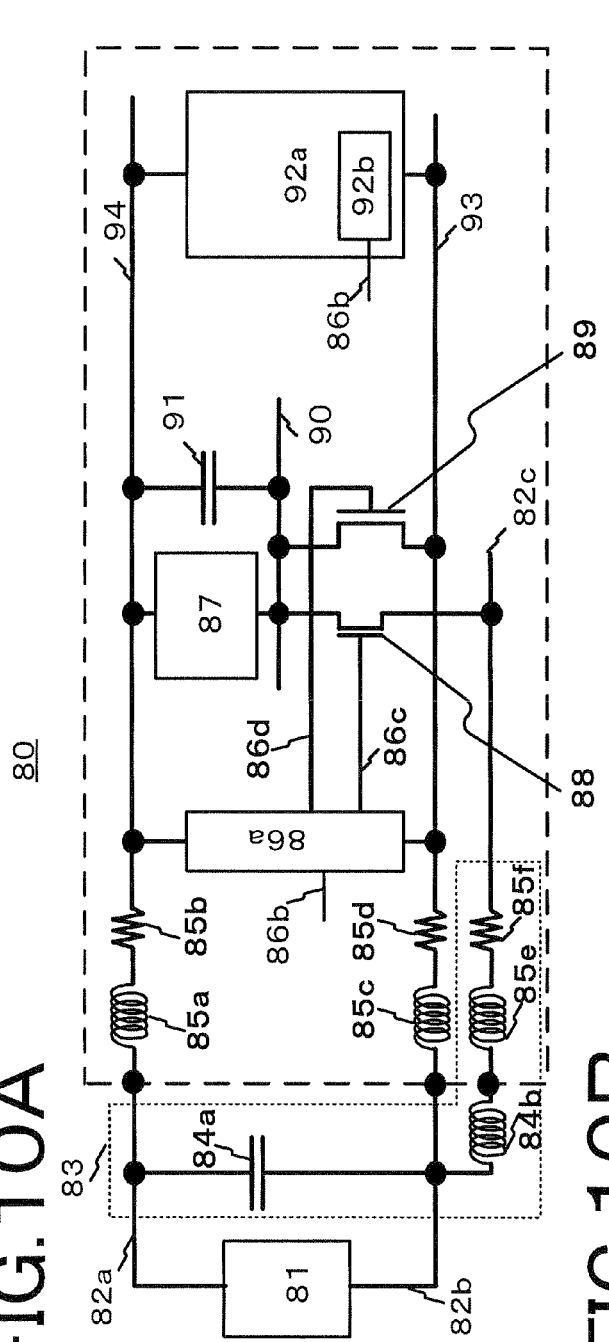
FIG. 10A is a diagram illustrating a semiconductor device according to a seventh embodiment (LSI 80, inductor 84b, and capacitor 84a)
Figure 10B:
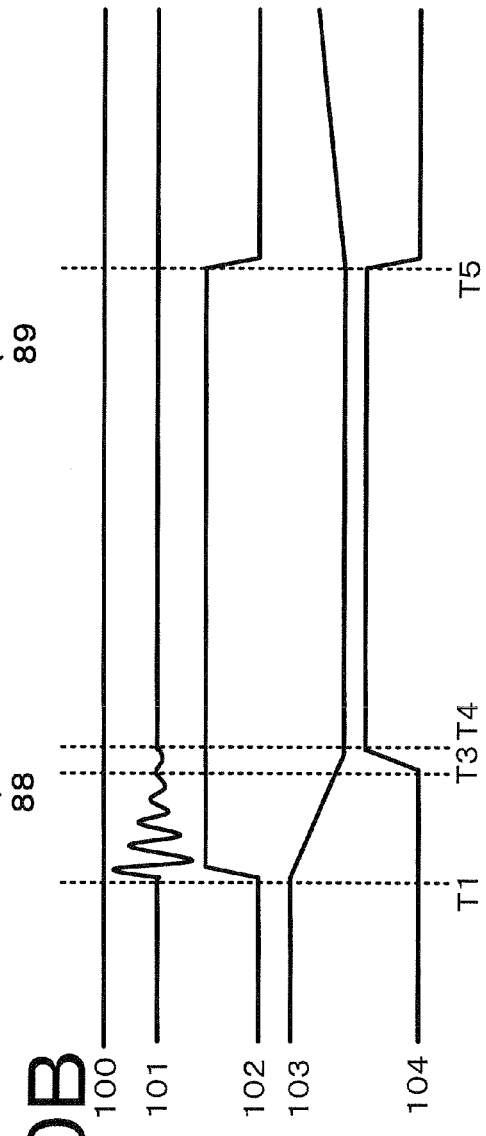
FIG. 10B illustrates potential waveform for each node accompanying the operation thereof.

FIG. 10A is a diagram illustrating a semiconductor device according to the seventh embodiment (LSI 80, inductor 84b, and capacitor 84a), and FIG. 10B illustrates potential waveform for each node accompanying the operation thereof. FIG. 10A illustrates the semiconductor device according to the seventh embodiment (LSI 80, inductor 84b, and capacitor 84a) and an external power IC 81.

The external power IC 81 is connected to the LSI 80 via a power line VDD 82a supplying high potential, and a power line VSS 82b supplying low potential (grounding potential). A capacitor 84a serving as a stabilizing capacitor is connected between the power line VDD 82a and the power line VSS 82b.

The LSI 80 has nodes including a node G1 (86c) and node G2 (86d), and has a code signal 86b. The LSI 80 has an inductor 85a, inductor 85c, inductor 85e, resistor 85b, resistor 85d, resistor 85f, gating transistor 88, gating transistor 89, power line VSSG1 (82c) to apply low potential (grounding potential), power line VSS 93 to apply low potential (grounding potential), power line VDD 94 to apply high potential, a circuit A 87 within the LSI 80, a circuit B 92a within the LSI 80, a power line VSSM 90 to connect to the circuit A 87, a stability capacitor C91, and a PMU 86a.

The circuit A 87 is an internal circuit within the LSI 80. The circuit A 87 is connected to the power line VDD 94 providing high potential and the power line VSSM 90 applying a low potential (grounding potential).

A stability capacitor C91 is connected between the power line VDD 94 and the power line VSS 94. The stability capacitor C91 serves to stabilize the potential of the circuit A 87.

The power line VSSM 90 is connected to the source of the gating transistor 88, and is connected to the power line VSSG1 (82c) which applies low potential, via the gating transistor 88. In addition, the power line VSSM 90 is connected to the source of the gating transistor 89, and is connected to the power line VSS 93 which applies low potential via the gating transistor 89.

A gate electrode of the gating transistor 88 is connected to the node G1 (86C). The gate electrode of the gating transistor 89 is connected to the node G2 (86D). Accordingly, the node G1 (86C) controls the potential of the node G2 (86D), whereby the connection/disconnection of the circuit A 87 with the power line VSSG1 (82c) or power line VSS 93 is controlled.

Note that the gating transistor 88 and gating transistor 89 are configured of an n-type transistor in the present embodiment. This is because in the case of supplying high potential to the circuit A 87 via the n-type transistor, the low potential from the power lines (VSS 93, VSSG1 (82c)) is transmitted without change to the n-type transistor, uninfluenced by a threshold.

However, the gating transistor 88 and gating transistor 89 may be formed with a p-type transistor. In such a case, the low potential is transmitted without change, whereby it is desirable that the logical level "L" potential of the signal output from a later-described PMU 86a to the node G1 (86c) and node G2 (86d) is a potential lower than the above-mentioned high potential by an amount within the threshold of the p-type transistor.

The PMU 86a receives the code signal 86b from the CPU 92b, to control the signal output to the node G1 (86c) and node G2 (86d). The PMU 86a receives the supply of power from the power source VSS 94 providing high potential and the low potential line VSS 93, to operate. Note that the circuit in the PMU 86a is the same as shown in FIGS. 2A and 2B. However, giving consideration to the fact that the gating transistor 88 and gating transistor 89 are n-type transistors, the inverter 6a-1, inverter 6a-2, inverter 6a-7, and inverter 6a-8 in the circuit shown in FIGS. 2A and 2B need to be replaced with amplifying circuits.

The CPU 92b is included in a later-described circuit B 92a, is constantly operating, and determines the necessity of the operation of the internal circuit of the circuit A 87 and so forth. Accordingly, turning the power source on/off of the circuit A 87 is performed based on determination by the CPU 92b. Note that with FIG. 10A, the CPU 92b is described as being included in the circuit B 92a, but an arrangement may be made wherein the CPU 92b is outside of the LSI 80 of the seventh embodiment, with the LSI 80 receiving the code signal 86b through the external terminal. In addition, the CPU 92b may be configured so as to be included in the PMU 86a.

In order to restore the potential of the circuit A 87, the power line VSSG1 (82c) which applies low potential is connected to the power line VSSM 90 of the internal circuit with the gating transistor 88. Note that the power line VSSG1 (82c) is connected to an external power line VSS 82b which applies low potential, via the inductor 85e and resistor 85f, through an external terminal of the LSI 80, and further via the inductor 84b.

The power line VSS 93 which applies low potential applies low potential to the circuit A 87, whereby after the power VSSG1 (82c) is connected to the power line VSSM 90, the power VSSG1 (82c) is connected to the power line VDDM 90 of the internal circuit by the gating transistor 89. Note that the power line VSS 93 is connected to the external power which applies low potential through the external terminal of the LSI 80, via the inductor 85c and resistor 85d.

Consequently, the inductor 84b, capacitor 84a, inductor 85e, and resistor 85f make up an LPF 83.

At the LSI 80, power noise which has been generated at the power line VSSG1 (82c) has the high-frequency component of the power noise removed by the low-pass filter LPF 83. That is to say, virtually no power noise passes through the LPF 83, so only a small amount thereof is transmitted to the power line VSS 82b. Further, fluctuations of potential having high frequency components deteriorate, so the power noise is not propagated to the power line VSS 93.

The power line VDD 94 which applies high potential is connected to an external power line VDD 82a which applies high potential, from the external terminal of the LSI 80, via the inductor 85a and resistor 85b.

The circuit B 92a is an internal circuit of the LSI 80 which operates by connecting to the power line VDD 94 which applies high potential, and the power line VSS 93 which applies low potential.

The power lines VDD 94 and VSS 93 are constantly connected to an external power IC 81, and the power source is not turned on/off. Accordingly, this includes the circuit group which is planned to constantly operate, the CPU 92b, or the clock generating circuit and so forth.

FIG. 10B is a diagram illustrating potential waveforms at each of the internal nodes, accompanying the operation of the LSI 80. That is to say, FIG. 10B illustrates a waveform 100 of the power line VSS 93, a waveform 101 of the power line VSSG1 (82c), a waveform 102 of the node G1 (86c), a waveform 104 of the node G2 (86d), and a waveform 103 of the power line VSSM 90 to connect the internal circuit A 87 of the LSI 80.

According to the waveform 100 of the power line VSS 93, the potential of the power line VSS 93 is maintained at low potential (grounding potential). Until the point-in-time T4, the power line VSS 93 and power line VSSG1 (82c) are not connected via the power line VSSM 90, whereby the power noise of the later-described power line VSSG1 (82c) is not transmitted to power line VSS 93 via the power line VSSM 90. In addition, after point-in-time T4 wherein both power lines (VSS 93 and VSSG1 (82c)) are connected to the power line VSSM 90 of the circuit A 87, the power noise subsides, and the power noise of the power line VSSG1 (82c) is not transmitted to the power line VSS 93 via the power line VSSM 90 of the circuit A 87.

According to the waveform 101 of the power line VSSG1 (82c), fluctuation of potential having high frequency components, i.e. so called power noise, appears in the power line VSSG1 (82c) immediately after the power line VSSG1 (82c) is connected to the power line VSSM 90 with the gating transistor 88 at point-in-time T1. This is because current suddenly flows from the power line VSSG1 (82c) as to the power line VSSM 90, whereby the potential of the power line VSSG1 (82c) becomes unstable. After this, the fluctuation of potential (power noise) converges at the power line VSSG1 (82c), and a constant high potential is maintained.

According to the waveform 102 of the node G1 (86c), the node G1 (86c) indicates the logical level "L" having low potential from the power line VSS 93, but thereafter, the gating transistor 88 is turned on at point-in-time T1, whereby the node G1 (86c) indicates the logical level "H" having high potential from the power line VDD 94. Further, thereafter, the gating transistor 88 is turned off at point-in-time T5, whereby the PMU 86a outputs a signal indicating the logical level "L" to the node G1 (86c).

Consequently, as the waveform 103 of the power line VSSM 90 indicates, the potential of the power line VSSM 90 which is connected to the circuit A 87 begins to drop, and the voltage drops to around the point of potential supplied by the power line VSSG1 (82c) at point-in-time T3. Thereafter, upon the gating transistor 88 and gating transistor 89 are turned off at point-in-time T5, the potential of the power line VSSM 90 naturally rises since the circuit A 87 consumes current.

According to the waveform 104 of the node G2 (86d), the node G2 (86d) indicates the logical level "L" having low potential indicated by the power line VSS 93 before point-in-time T3, and thereafter the gating transistor 89 is turned on at point-in-time T3, whereby the node G2 (86d) indicates the logical level "H" having high potential supplied from the power line VDD 94. Thereafter, the gating transistor 89 is turned off, whereby the PMU 86a outputs a signal indicating the logical level "L" to the node G2 (86d) at point-in-time T5.

Thus, the LSI 80 according to the seventh embodiment has a power line VSSG1 (82c), power line VSS 93, and power line VSSM 90. In addition, the LSI 80 according to the seventh embodiment has a gating transistor 88 to connect/disconnect the power line VSSG1 (82c) and the power line VSSM 90, and a gating transistor 89 to connect/disconnect the power line VSS 93 and the power line VSSM 90. In addition, the LSI 80 according to the seventh embodiment has a PMU 86a or a PMU 86a and CPU 92b to which voltage is supplied from the power line VSS 93, wherein the gating transistor 88 drives the G1 (86c) so as to connect the power line VSSG1 (82c) and the power line VSSM 90, and thereafter, the gating transistor 89 drives the G2 (86d) so as to connect the power line VSS 93 and power line VSSM 90.

The circuit A 87 which is subjected to power on/off control is connected to the power line VSSM 90, and the circuit B 92a and PMU 86a which constantly have the power turned on are connected to the power line VSS 93.

With the LSI 80, in the event that the power source is turned on as to the circuit A 87, power noise occurs only at the power line VSSG1 (82c), and the above-mentioned noise is not propagated to the power line VSS 93 via the power line VSSM 90.

Consequently, there is the advantage that the above-mentioned power noise does not influence the circuit 92a or the circuit within the PMU 86a having a stable operation or constant operation.

For example, the CPU 92b within the circuit 92a and the clock generating circuit are not influenced by the power noise, whereby stable operations is performed.

With to the semiconductor device according to the seventh embodiment, current is supplied suddenly from the power line VSSG1 (82c) to the VSSM 90, and the restoring time for the voltage of the power line VSSM 90 is shortened.

Eighth Embodiment

The eighth embodiment relates to a semiconductor device having a first power line (VDDG1 (127)) and second power line (VDD 123) wherein a constant voltage is constantly maintained, a third power line (VDDM 120) of an internal circuit connected to the second power line after being connected to the first power line, a first switch to connect/disconnect the first power line and third power line, a second switch to connect/disconnect the second power line and third power line, and a control circuit to control the on/off of the first and second switches and the sequence of the on/off thereof. Note that the semiconductor device (LSI 70) according to the eighth embodiment and the semiconductor device (LSI 15B) according to the second embodiment differ in this point.

FIG. 11A is a circuit diagram illustrating a semiconductor device according to the eighth embodiment (LSI 130, inductor 17b, and capacitor 17c).

The LSI 130 has nodes including a node G1 (114) and node G2 (115a) and Lg2 (115b), and has a code signal 116b and signal VREF 126a. The LSI 130 has an inductor 16a made up of a coil formed with wiring, an inductor 16c made up of a coil formed with wiring, an inductor 16e made up of a coil formed with wiring, a resistor 16b, resistor 16d, resistor 16f, a gating transistor 118, gating transistor 119, a power line VDDG1 (127) to apply high potential, power line VDD 123 to apply high potential, a power line VSS 124 to apply low potential, a circuit A 117 within the LSI 130, a circuit B 122a within the LSI 130, a power line VDDM 120 to connect to the circuit A 117, a stability capacitor C121, and a PMU 116a.

The circuit A 117 is an internal circuit within the LSI 130. The circuit A 117 is connected to the power line VDDM 120 and the power line VSS 124 applying a low potential (grounding potential).

The stability capacitor C121 connects between the power line VDDM 120 and the power line VSS 124 applying low potential. The stability capacitor C121 serves to stabilize the potential of the circuit A 117.

The circuit B 122a is an internal circuit of the LSI 130 which operates by connecting to the power line VDD 123 which applies high potential, and the power line VSS 124 which applies low potential.

The power lines VDD 123 and VSS 124 are constantly connected to the external power IC 18, and the power source is not turned on/off. Accordingly, this includes the circuit group which is planned to constantly operate, i.e., the CPU 122b, VREF generating circuit 126b, and clock generating circuit and so forth.

The power line VDDM 120 is connected to the drain of the gating transistor 118, and is connected to the power line VDDG1 (127) which applies high potential, via the gating transistor 118. In addition, the power line VDDM 120 is connected to the drain of the gating transistor 119, and is connected to the power line VDD 123 which applies high potential via the gating transistor 119.

The CPU 122b is included in the circuit B 122a, is constantly operating, and determines the necessity of the operation of the internal circuit of the circuit A 117 and so forth. Accordingly, turning the power source on/off of the circuit A 117 is performed based on determination by the CPU 122b. That is to say, the CPU 122b outputs the code signal 116b according to the on/off of the power of the circuit A 117. Note that above, the CPU 122b is described as being included in the circuit B 122a, but an arrangement may be made wherein the CPU 122b is outside of the LSI 130 of the eighth embodiment, with the LSI 130 receiving the code signal 116b through the external terminal. In addition, the CPU 122b may be configured so as to be included in a later-described PMU 116a.

The PMU 116a receives the code signal 116b from the CPU 122b, to control the signal output to the node G1 (114) and node G2 (115a). The PMU 116a receives the supply of high potential from the power source VDD 123, and receives the supply of the low potential from the power source VSS 124. Note that the circuit example of the PMU 116a is the same as shown in FIGS. 2A and 2B. However, the inverter 6a-2 in FIG. 2A which outputs signals to the node G2 (115a) needs to be replaced with an amplifying circuit. The signal 6bX in FIG. 2A is a pulse signal corresponding to G1 (114) which normally is at the logical level "L", but in order to select the gating transistor 8, assumes the logical level "H" for a fixed period of time.

The signal 6bY in FIG. 2A is a pulse signal corresponding to G2 (115) which normally is at the logical level "L", but in order to select the gating transistor 9, assumes the logical level "H" for a fixed period of time. However, the signal 6bY becomes a pulse state delayed by a predetermined period of time from the signal 6bX simultaneous with the pulse state of the signal 6bX ending. Note that the above-mentioned period of time is determined by the CPU 122b.

Now, the gate electrode of the gating transistor 118 is connected to the node G1 (114). Accordingly, the PMU 116a controls connection/disconnection of the power line VDDM 120 of the circuit A 117 and the power line VDDG1 (127) by controlling the potential of the node G1 (114).

The VREF generating circuit 126b is included in the circuit B 122a. The VREF generating circuit 126b is a circuit which outputs a signal VREF 126a indicating the voltage to serve as a reference for the potential of the power line VDDM 120 of the circuit A 117. The VREF generating circuit 126b is a circuit configured of, for example, a voltage dividing circuit made up of multiple resistors connected serially between the VDD 123 and VSS 124, and a terminal for outputting voltage from an intermediate node connecting between predetermined resistors.

The step-down control unit 125 is a circuit which is activated upon receiving the above node G2 (115a). The step-down control unit 125 is a circuit for outputting signals to control on/off of the gating transistor 119 as to the gate electrode of the gating transistor 119, via the node Lg2 (115b). That is to say, the step-down control unit 125 receives the VREF 126, and in the event that the potential of the power line VDDM 120 is higher than the potential of the signal VREF 126, outputs a signal Lg2 (115b) having the logical level "H" whereby the gating transistor 119 is turned off. In addition, in the event that the potential of the power line VDDM 120 is lower than the potential of the signal VREF 126a, the step-down control unit 125 outputs a signal Lg2 (115b) having the logical level "L" whereby the gating transistor 119 is turned on. Accordingly, the PMU 116a controls connection/disconnection of the power line VDDM 120 of the circuit A 117 and the power line VDD 123 by controlling the potential of the node G2 (115a).

Thus, the step-down control unit 125 and the gating transistor 119 make up a regulator circuit which acts to maintain the potential of the power line VDDM 120 at the potential of the signal VREF 126a. This is because in the event that the potential of the power line VDDM 120 is greater than the potential of the signal VREF 126a, the gating transistor 119 goes off and the potential of the power line VDDM 120 drops, while in the event that the potential of the power line VDDM 120 is lower than the potential of the signal VREF 126a, the gating transistor 119 goes on and the potential of the power line VDDM 120 rises.

Note that the operation period of the above regulator circuit is determined by the potential of signals output from the PMU 116a to the node G2 (115a).

The external power IC 18 is a power source which supplies high potential by way of the power line VDD 19a, and supplies low potential by way of the power line VSS 19b. That is to say, the external power source IC 18 is a normal DC/DC converter, for example. A capacitor 17C for stabilizing potential is connected between the power line VDD 19a and power line VSS 19b.

The power line VDDG1 (127) is connected to the external power line VDD 19a which supplies high potential via the inductor 16a and resistor 16b, through an external terminal of the LSI 130, and further via the inductor 17b.

The power line VDD 123 providing high potential is connected to the external power line VDD 19a which supplies high potential via the inductor 16c and resistor 16d, through the external terminal of the LSI 130.

Note that the capacitor 17C, inductor 17b, inductor 16a, and resistor 16b make up a low-pass filter LPF 17a. Accordingly, the power noise of the power line VDDG1 (127) is not transmitted to the power line VDD 123 via the external power line VDD 19a.

The power line VSS 124 which provides low potential (grounding potential) is connected to the external power line VSS 19b supplying the grounding potential via the inductor 16e and resistor 16f, through the external terminal of the LSI 130.

FIG. 11B illustrates potential waveforms at each of the internal nodes, accompanying the operation of the LSI 130. That is to say, FIG. 11B illustrates a waveform 131 of the power line VDD 123, a waveform 132 of the power line VDDG1 (127), a waveform 133 of the node G1 (114), a waveform 136 of the node G2 (115a), a waveform 135 of the power line VDDM 120 to connect the internal circuit A 117 of the LSI 130, and the potential of the VREF 126a.

According to the waveform 131 of the power line VDD 123, the potential of the power line VDD 123 is maintained at a fairly high potential. Until the point-in-time T4, the power line VDD 123 is not connected to the power line VDDM 120, whereby the power noise of the later-described power line VDDG1 (127) is not transmitted to power line VDD 123 via the power line VDDM 120. In addition, at the point-in-time T4 and thereafter wherein the power line VDD 123 is connected to the power line VDDM 120, the power noise of the power line VDDG1 (127) subsides, and the power line VDDG1 (127) is disconnected from the power line VDDM 120, so the power noise is not transmitted to the power line VDD 123.

According to the waveform 132 of the power line VDDG1 (127), fluctuation of potential having high frequency components, i.e. so called power noise, appears in the power line VDDG1 (127) immediately after the power line VDDG1 (127) is connected to the power line VDDM 120 with the gating transistor 118 at point-in-time T1. This is because current suddenly flows from the power line VDDG1 (127) as to the power line VDDM 120, whereby the potential of the power line VDDG1 (127) becomes unstable. After this, the fluctuation of potential (power noise) converges at the power line VDDG1 (127), and a constant high potential is maintained.

According to the waveform 133 of the node G1 (114), the node G1 (114) indicates the logical level "H" having high potential from the power line VDD 123 before point-in-time T1, but thereafter, the gating transistor 118 is turned on at point-in-time T1, whereby the node G1 (114) indicates the logical level "L" having low potential from the power line VSS 14. Further, thereafter, the gating transistor 118 is turned off at point-in-time T5, whereby the PMU 116a outputs a signal indicating the logical level "H" to the node G1 (114).

According to the waveform 136 of the node G2 (115a), the node G2 (115a) indicates the logical level "L" having low potential indicated by the power line VSS 124 before point-in-time T3, and thereafter the gating transistor 119 is turned on at point-in-time T3, whereby the node G2 (115a) indicates the logical level "H" having high potential supplied from the power line VDD 123. Thereafter, the gating transistor 119 is turned off, whereby the PMU 116a outputs a signal indicating the logical level "L" to the node G2 (115a) at point-in-time T5.

Consequently, as the waveform 135 of the power line VDDM 120 indicates, the potential of the power line VDDM 120 which is connected to the circuit A 117 begins to rise, and the voltage is generally restored to around the potential of the signal VREF 126 at point-in-time T3. This is because the potential of the power line VDDM 120 is controlled by the regulator circuit configured of the step-down control unit 125 and gating transistor 119, so as to be the same potential as the potential of the signal VREF 126a. Thereafter, when the gating transistor 119 is turned off at point-in-time T5, the potential of the power line VDDM 120 naturally drops since the circuit A 117 consumes current.

Thus, the LSI 130 according to the eighth embodiment has a power line VDDG1 (127), power line VDD 123, and power line VDDM 120. In addition, the LSI 130 according to the eighth embodiment has a gating transistor 118 to connect/disconnect the power line VDDG1 (127) and the power line VDDM 120, and a gating transistor 119 to connect/disconnect the power line VDD 123 and the power line VDDM 120. In addition, the LSI 130 according to the eighth embodiment has a PMU 116a or PMU 116a and CPU 12b, to which voltage is supplied from the power line VDD 123, wherein the gating transistor 118 drives the node G1 (114) so as to connect the power line VDDG1 (127) and the power line VDDM 120, and thereafter, the gating transistor 119 drives the node G2 (115a) so as to repeatedly connect/disconnect the power line VDDM 120 and power line VDD 123 such that the potential of the power line VDDM 120 and potential of VREF 126a are the same potential.

The circuit A 117 which is subjected to power on/off control is connected to the power line VDDM 120, and the circuit B 122a and PMU 116a which constantly have the power turned on are connected to the power line VDD 123.

With the LSI 130, in the event that the power source is turned on as to the circuit A 117, power noise occurs only at the power line VDDG1 (127), and the above-mentioned noise is not propagated to the power line VDD 123 via the power line VDDM 120.

Consequently, there is the advantage that the above-mentioned power noise does not influence the circuit 122a or the circuit within the PMU 116a having a stable operation or constant operation.

For example, the CPU 122b within the circuit 122a and the clock generating circuit are not influenced by the power noise, whereby stable operations is performed.

With the semiconductor device according to the eighth embodiment, current is supplied suddenly from the power line VDDG1 (127) to the VDDM 120, and the restoring time for the voltage of the power line VDDM 120 is shortened.

FIG. 11C illustrates a circuit example of the step-down control unit 125. The step-down control unit 125 is configured of a difference amplifier 129a, a p-type MOS transistor 129b, and an n-type MOS transistor 129c. The difference amplifier 129a receives the signal VREF 126a and the power line VDDM 120 at one and the other input terminals, and in the event that the potential of the signal VREF 126a is higher than the potential of the power line VDDM 120, outputs a logical level "L" signal to the node Lg2 (115b), but in the event that the potential of the signal VREF 126a is lower than the potential of the power line VDDM 120, outputs a logical level "H" signal to the node Lg2 (115b). Note that the high potential power source for the difference amplifier 129a is supplied from the power line VDD 123, while the low potential power source is supplied from the VSS 124 via the n-type transistor 129c.

At the n-type MOS transistor 129c, the drain connects to the low-potential power supply terminal of the differential amplifier 129a, the source connects to the VSS 124, and the gate electrode connects to the node G2 (115a).

At the p-type MOS transistor 129b, the drain connects to the output terminal of the differential amplifier 129a, the source connects to the VDD 123, and the gate electrode connects to the node G2 (115a).

With the above configuration, the step-down control unit 125 is activated when the node G2 (115a) is at logical level "H", i.e., serves as a control unit of a step-down circuit for stepping down the potential supplied from the power line VDD 123 to the gating transistor 119 so as to be supplied to the power line VDDM 120. On the other hand, when the node G2 (115a) is at logical level "L", the step-down control unit 125 stops operating as a control unit, and outputs a logical level "H" signal to the node Lg2 (115b).

Consequently, when the step-down control unit 125 is active, the gating transistor 119 is turned on/off in accordance with the difference potential between the potential of the signal VREF 126a and the potential of the power line VDDM 120, and control is effected such that the potential of the power line VDDM 120 is the same potential as the potential of the signal VREF 126a. On the other hand, in the event that the step-down control unit 125 is stopped, the gating transistor 119 turns off, no power is supplied to the power line VDDM 120, and the potential is not maintained.

Ninth Embodiment

The ninth embodiment relates to a semiconductor device having a first power line (VDDG1 (51)) and second power line (VDD 52) wherein a constant voltage is constantly maintained, multiple third power lines (VDDM4m) of internal circuits connected to the second power line after being connected to the first power line (wherein m is an integer from 4 to n), multiple first switches to connect/disconnect the first power line and third power lines, multiple second switches to connect/disconnect the second power line and third power lines, and a control circuit to control the on/off of the first and second switches and the sequence of the on/off thereof. The above-mentioned control circuit includes a circuit which controls the potential of the multiple third power lines (VDDM4m) (wherein m is an integer from 4 to n) to a potential which is different from the potential of the second power line (VDD 52).

Figure 12A:
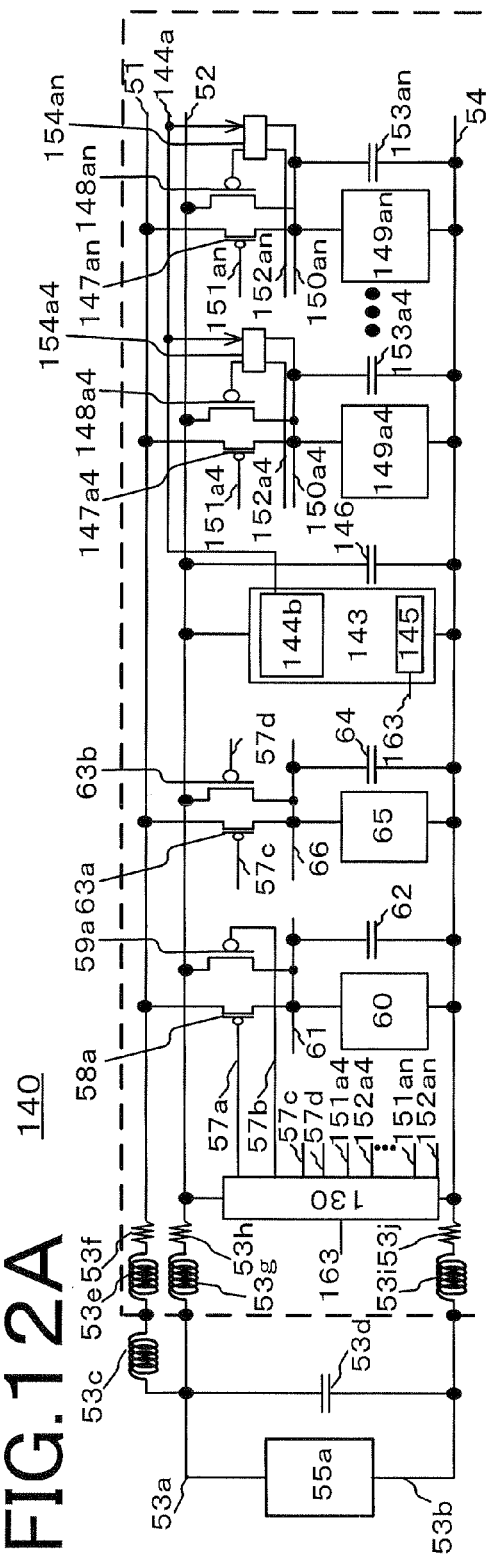
FIG. 12A is a diagram illustrating a semiconductor device according to a ninth embodiment (LSI 140)
Figure 12B:
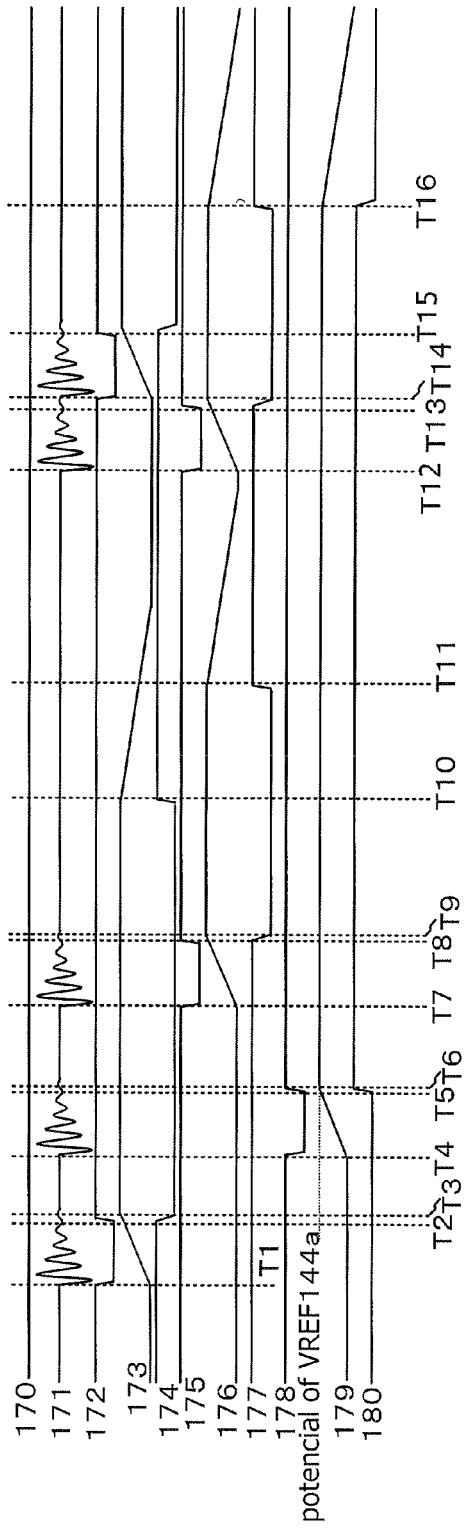
FIG. 12B illustrates potential waveforms at each of the nodes, accompanying the operation thereof.

FIG. 12A is a diagram illustrating a semiconductor device according to the ninth embodiment (LSI 140), and FIG. 12B illustrates potential waveforms at each of the nodes, accompanying the operation thereof. FIG. 12A illustrates the LSI 50a and external power IC 55a of the ninth embodiment.

The external power IC 55a operates in the same way as the external power IC 55a shown in FIG. 6A. This arrangement is in addition similar in that connections between the external power IC 55a and the power line VDD 53a, and between the external power IC 55a and the power line VDDG1 (51), are made via the inductors 53c and so forth.

With the exception of the PMU 56a, the LSI 140 includes the circuit components configuring the LSI 50a. The LSI 140 further includes a PMU 130, circuit C 143, and multiple circuits Dm (wherein m is an integer from 4 to n).

The circuit A 60 and circuit B 65 are the same as those shown in FIG. 6A. Accordingly, the power line VDDM1 (61) of the circuit A 60 is connected/disconnected as to the power line VDDG1 (51) and VDD 52 by the gating transistor 58a and gating transistor 59a, and in the same way, the power line VDDM2 (66) of the circuit B 65 is connected/disconnected as to the power line VDDG1 (51) and VDD 52 by the gating transistor 63a and gating transistor 63b. In addition, the circuit A 60 and circuit B 65 are supplied with ground potential from the power line VSS 54. Further, the gating transistor 58*a* and gating transistor 59*a* are driven by signals output to the node G11 (57*a*) and node G21 (57*b*), and the gating transistor 63*a* and gating transistor 63*b* are driven by signals output to the node G12 (57*c*) and node G22 (57*d*). Note that signals output to the nodes G11 (57*a*), G21 (57*b*), G12 (57*c*), and G22 (57*d*) are output from the PMU 130.

The circuit C 143 includes a VREF generating circuit 144*b* and CPU 145. The VREF generating circuit 144*b* generates a reference potential, and outputs this to the signal line VREF 144*a*. The CPU 145 determines whether or not the circuit A 60, circuit B 65, and the multiple circuits Dm (wherein m is an integer from 4 to n) are operating, so as to determine the periods for tuning the power on/off for these circuits. Code signals 163 are output based on the determination made thereby. Note that the circuit C 143 receives supply of high potential from the power line VDD 52, and receives supply of low potential (ground potential) from the power line VSS 54. Accordingly, the circuit C 143 is not turned on/off, and is constantly operating.

Upon receiving the code signals 163, the PMU 130 outputs control signals to the nodes G11 (57*a*), G21 (57*b*), G12 (57*c*), G22 (57*d*), G1*m* (151*am*) (wherein m is an integer from 4 to n), and G2*m* (152*am*) (wherein m is an integer from 4 to n), to perform connection/disconnection of the power line VDDM1 (61), VDDM2 (66), and VDDM4*m* (150*am*) (wherein m is an integer from 4 to n) of the circuit A 60, circuit B 65, and multiple circuits Dm (wherein m is an integer from 1 to n) as to the power line VDDG1 (51) and power line VDD 52. Note that the PMU 130 receives supply of high potential from the power line VDD 52, and receives supply of low potential (ground potential) from the power line VSS 54. Accordingly, power to the PMU 130 is not turned on/off, and is constantly operating.

The power lines VDDM4*m* (150*am*) (wherein m is an integer from 4 to n) of the circuits Dm (wherein m is an integer from 4 to n) are connected/disconnected as to the power line VDDG1 (51) and power line VDD 52 by gating transistors 147*am* and gating transistors 148*am* (wherein m is an integer from 4 to n). In addition, the circuits Dm (wherein m is an integer from 4 to n) receive supply of low potential (ground potential) from the power line VSS 54. Further, the gating transistors 147*am* (wherein m is an integer from 4 to n) are driven by signals output to the node G1*m* (151*am*) (wherein m is an integer from 4 to n), and the gating transistors 148*am* (wherein m is an integer from 4 to n) are driven by signals output from step-down control units 154*am* (wherein m is an integer from 4 to n). Further, the active/non-active state of the step-down control units 154*am* (wherein m is an integer from 4 to n) is controlled by signals output to the node G2*m* (wherein m is an integer from 4 to n). The step-down control units 154*am* (wherein m is an integer from 4 to n) are a circuits the same as that shown in FIG. 11*c*, and output signals with logical level "H" or logical level "L" to gate electrodes of the gating transistors 148*am* (wherein m is an integer from 4 to n), in accordance with the potential of the signal line VREF 144*a*. Consequently, the potential of the power source lines VDDM4*m* (150*am*) (wherein m is an integer from 4 to n) is not the potential of the power source line VDD 52, but rather a potential the same as the potential of the signal line VREF 144*a*.

FIG. 12B illustrates potential waveforms at each of the internal nodes, accompanying the operation of the LSI 140. That is to say, FIG. 12B illustrates a waveform 170 of the power line VDD 52, a waveform 171 of the power line VDDG1 (51), a waveform 172 of the node G11 (57*a*), a waveform 174 of the node G21 (57*b*), a waveform 175 of the node G12 (57*c*), a waveform 177 of the node G22 (57*d*), a waveform 173 of the power line VDDM1 (61) to connect to the internal circuit A 60 of the LSI 140, and a waveform 176 of the power line VDDM2 (66) to connect to the internal circuit B 60 of the LSI 140.

According to the waveform 170 of the power line VDD 52, the potential of the power line VDD 52 is maintained at a fairly high potential. According to waveform 172 of the node G11 (57*a*), the node G11 (57*a*) is at the logical level "L", and during the period from point-in-time T1 to point-in-time T2 and the period from point-in-time T12 to point-in-time T13, the power line VDDG1 (51) and power line VDDM1 (61) are connected. However, at other periods, the node G11 (57*a*) is at the logical level "H", and the power line VDDG1 (51) and power line VDDM1 (61) are disconnected. Accordingly, power noise generated by the power line VDDG1 (51) being connected to a circuit other than the circuit A 60 is not transmitted to the power line VDDM1 (61). In addition, according to the waveform 174 of the node G21 (57*b*), the node G21 (57*b*) is at the logical level "L", so at the period from point-in-time T3 to point-in-time T10 and the period from point-in-time T15 on, when the power line VDD 52 connects to the power line VDDM1 (61) of the circuit A 60, the power noise of the power line VDDM1 (61) has subsided. According to the waveform 173 of the power line VDDM1 (61), so there is no transmission of power noise to the power line VDD 52 via the power line VDDM1 (61).

In the same way, as we can see from the waveform 175 of the node G12 (57*c*), the potential of the node G12 (57*c*) is at the logical level "L", and during the period from point-in-time T7 to point-in-time T8 and the period from point-in-time T12 to point-in-time T13, the power line VDDG1 (51) and power line VDDM2 (66) are connected. However, during the period from point-in-time T8 to point-in-time T12, the node G12 (57*c*) is at the logical level "H", and a the period from point-in-time T4 on, the power line VDDG1 (51) and power line VDDM2 (66) are disconnected. Accordingly, power noise generated by the power line VDDG1 (51) being connected to another circuit is not transmitted to the power line VDDM2 (66). In addition, according to the waveform 177 of the node G22 (57*d*), the node G22 (57*d*) is at the logical level "L", so at the period from point-in-time T9 to point-in-time T11 and the period from point-in-time T14 to point-in-time T16, when the power line VDD 52 connects to the power line VDDM2 (66) of the circuit B 65, the power noise of the power line VDDM2 (66) has subsided, according to the waveform 176 of the power line VDDM2 (66), so there is no transmission of power noise to the power line VDD 52 via the power line VDDM2 (66).

According to the waveform 178 of the nodes G14 (151*a*4), the potential of the nodes G14 (151*a*4) is at the logical level "L", and during the period from point-in-time T4 to point-in-time T5 the power line VDDG1 (51) and power lines VDDM44 (151*a*4) are connected. However, at other periods, the nodes G14 (151*a*4) are at the logical level "H", and the power line VDDG1 (51) and power lines VDDM44 (150*a*4) are disconnected. Accordingly, power noise generated by the power line VDDG1 (51) being connected to a circuit to her than the circuit D1 (149*a*4) is not transmitted to the power lines VDDM44 (150*a*4). In addition, according to the waveform 180 of the nodes G24 (152*a*4), the nodes G24 (152*a*4) are at the logical level "L", so upon the potential of the power lines VDDM44 (150*a*4) and the potential of the signal line VREF 144*a* becoming the same, the power line VDD 52 connects to the power lines VDDM44 (150*a*4) of the circuit D1 (149*a*4). At the period from point-in-time T5 to point-intime T16, when thus connected, the power noise of the power line VDDM44 (150a4) has subsided, According to the waveform 179 of the power lines VDDM44 (150a4), so there is no transmission of power noise to the power line VDD 52 via the power lines VDDM44 (150a4).

In the same way, power noise generated by a circuit other than the circuits Dm (149am) (wherein m is an integer from 4 to n) connecting to the VDDG1 (51) is not transmitted to the power lines VDDM4m (wherein m is an integer from 4 to n) connecting to the circuits Dm (149am) (wherein m is an integer from 4 to n). In addition, at the time of the power lines VDDM4m (wherein m is an integer from 4 to n) connecting to the power line VDD 52, the power noise has subsided, so power noise is not transmitted to the power line VDD 52 via the power lines VDDM4m (wherein m is an integer from 4 to n).

According to the waveform 171 of the power line VDDG1 (51), fluctuation of potential having high frequency components, i.e. so called power noise, appears in the power line VDDG1 (51) immediately after the power line VDDG1 (51) is connected to the power line VDDM1 (61) with the gating transistor 58a at point-in-time T1 and T12, with the gating transistor 63a at point-in-time T7 and T10, and with the gating transistor 147a4 at point-in-time T4. After this, the fluctuation of potential (power noise) converges at the power line VDDG1 (51), and a constant high potential is maintained.

Thus, the LSI 140 according to the ninth embodiment has a power line VDDG1 (51), power line VDD 52, multiple power lines connected to the internal circuits (power line VDDM1 (61), power line VDDM2 (66), and multiple power source lines VDDM4m (150am) (wherein m is an integer from 4 to n)). In addition, the LSI 140 according to the ninth embodiment has gating transistors to connect/disconnect the power line VDDG1 (51) and the multiple power lines connected to the internal circuits, and gating transistors to connect/disconnect the power line VDD 52 and the multiple power lines connected to the internal circuits. In addition, the LSI 140 according to the ninth embodiment has step-down control units 154am (wherein m is an integer from 4 to n) for connecting to the gate electrodes of the above gating transistors.

In addition, the PMU 130 according to the ninth embodiment drives the nodes G11 (57a), G12 (57c), and G1m (151am) (wherein m is an integer from 4 to n) so as to connect the gating transistors 58a, 63a, and 147am (wherein m is an integer from 4 to n) to the power lines VDDG1 (51), VDDM1 (61), VDDM2 (66), and VDDM4m (150am). Thereafter, the PMU 130 according to the ninth embodiment drives the nodes G11 (57a), G12 (57c), and G1m (151am) (wherein m is an integer from 4 to n) so as to disconnect the power lines. In addition, the PMU 130 drives the nodes G21 (57b), G22 (57d), and 152am (wherein m is an integer from 4 to n) so as to connect the gating transistors 59a, 63b, and 148am (wherein m is an integer from 4 to n) to the power lines VDD 52, VDDM1 (61), VDDM2 (66), and VDDM4m (150am) (wherein m is an integer from 4 to n).

The circuit A 60, circuit B 65, and circuits Dm (149am) (wherein m is an integer from 4 to n), which are subjected to power on/off control, are connected to the power lines VDDM1 (61), VDDM2 (66), and VDDM4m (150am) (wherein m is an integer from 4 to n), and the PMU 130 and circuit C143 which constantly have the power turned on are connected to the power line VDD 52.

With the LSI 140, in the event that power is turned on as to the circuits Dm (149am) (wherein m is an integer from 4 to n) and so forth, power noise occurs only at the power line VDDG1 (51), and the noise is not propagated to the power line VDD 52 via the power lines VDDM1 (61), VDDM2 (66), or VDDM4m (150am) (wherein m is an integer from 4 to n).

Consequently, there is the advantage that the above-mentioned power noise does not influence the circuit within the PMU 130 having a stable operation or constant operation.

In addition, even in the event that the potential of other circuits rises while the circuits Dm (149am) (wherein m is an integer from 4 to n) and so forth are operating, power noise is not propagated to the circuits Dm (149am) (wherein m is an integer from 4 to n) and so forth, and the circuits Dm (149am) (wherein m is an integer from 4 to n) and so forth operates in a stable manner.

With the semiconductor device according to the ninth embodiment, current is supplied suddenly from the power line VDDG1 (51) to the power line power lines VDDM1 (61), VDDM2 (66), or VDDM4m (150am) (wherein m is an integer from 4 to n), and the restoring time for the voltage of the power lines VDDM1 (61), VDDM2 (66), or VDDM4m (150am) (wherein m is an integer from 4 to n) is shortened.

What is claimed is:

1. A semiconductor device comprising:
    a first power line supplied with first power supply voltage;
    a second power line supplied with second power supply voltage;
    a third power line electrically connected to a internal circuit;
    a first switch configured to electrically connect or disconnect the first power line and the third power line;
    a second switch configured to electrically connect or disconnect the second power line and the third power line;
    a control circuit controlling the second switch to electrically connect the second power line and the third power line following a predetermined period after controlling the first switch to electrically connect the first power line and the third power line; and
    a reference potential generating circuit configured to generate a reference potential,
    wherein the control circuit comprises a potential detecting circuit configured to output a potential detection signal corresponding to a potential of the third power line,
    wherein the predetermined period is a period based on the potential detection signal corresponding to the potential of the third power line after the first switch is controlled to electrically connect the first power line and the third power line,
    wherein the potential detecting circuit compares the potential of the third power line with the reference potential, and
    wherein the potential detecting circuit outputs a first logical potential detection signal as the potential detection signal when the potential of the third power line is equal to or greater than the reference potential, and the potential detecting circuit output a second logical potential detection signal as the potential detection signal when the potential of the third power line is smaller than the reference potential.

2. The semiconductor device according to claim 1, wherein the potential detecting circuit outputs the potential detection signal when the potential of the third power line exceeds a predetermined potential.

3. The semiconductor device according to claim 1, wherein the first power line, the second power line, and the third power line supply low potential.

4. The semiconductor device according to claim 1, further comprising:
    a first circuit group electrically connecting to the second power line and constantly operating; and a second circuit group including the internal circuit and electrically connecting to the third power line.

5. The semiconductor device according to claim 4, the control circuit further comprising:
a first signal line electrically connected to the first switch and driven by the control circuit such that the first switch connects the first power line and the third power line;
a second signal line electrically connected to the second switch and driven by the control circuit such that the second switch connects the second power line and the third power line;
a delay circuit configured to delay a signal for starting driving of the first signal line, and generating a signal for starting driving of the second signal line;
wherein the predetermined period is a period determined by the delay.

6. The semiconductor device according to claim 5, further comprising:
a low pass filter electrically connected between the first power line and the second power line.

7. The semiconductor device according to claim 6, wherein the low pass filter is built in.

8. The semiconductor device according to claim 7, wherein the first power line and the second power line are electrically connected to different external power sources.

9. A semiconductor device comprising:
a first power line;
a second power line;
a third power line;
a first signal line;
a second signal line;
a first switch configured to connect and disconnect the first power line and the third power line, the first switch being controlled by the first signal line;
a second switch configured to connect and disconnect the second power line and the third power line, the second switch being controlled by the second signal line; and
a control circuit supplied with voltage by the second power line, the control circuit driving the first signal line such that the first switch connects the first power line and the third power line, following a predetermined period, driving the second signal line such that the second switch connects the second power line and the third power line, and driving the first signal line such that the first switch disconnects the first power line and the third power line while continuing to drive the second signal line such that the second switch continues to connect the second power line and the third power line.

10. The semiconductor device according to claim 9, further comprising:
a fourth power line;
a third signal line;
a fourth signal line;
a third switch configured to connect and disconnect the first power line and the fourth power line, the third switch being controlled by the third signal line;
a fourth switch configured to connect and disconnect the second power line and the fourth power line, the fourth switch being controlled by the fourth signal line; and
wherein the control circuit further independently drives the third signal line such that the third switch connects the first power line and the fourth power line, and following a predetermined period, drives the fourth signal line such that the fourth switch connects the second power line and the fourth power line, and drives the third signal line such that the third switch disconnects the first power line and the fourth power line.

11. The semiconductor device according to claim 10, wherein the first switch, the second switch, the third switch, and the fourth switch are configured of n-type MOS transistors.

12. The semiconductor device according to claim 11, further comprising:
a sixth power line supplying a potential which is higher than the potential of the first power line or the second power line by an amount equal to greater than the threshold value of the n-type MOS transistor;
wherein the first signal line, the second signal line, the third signal line, and the fourth signal line, are driven between the potential supplied by the sixth power line and a ground potential.

13. The semiconductor device according to claim 10, further comprising:
a fifth power line;
a fifth switch configured to connect and disconnect the first power line and the fifth power line, the fifth switch being controlled by the fifth signal line;
a sixth switch configured to connect and disconnect the second power line and the fifth power line, a sixth switch being controlled by the sixth signal line;
wherein the control circuit including
a reference potential generating circuit configured to generate a reference potential, and
a potential detecting circuit which, upon comparing the potential of the fifth power line and the reference potential, outputs potential detection signals having different logical values depending on a case wherein the potential of the fifth power line exceeds the reference potential, and a case wherein the potential of the fifth power line is smaller than the reference potential;
wherein the control circuit further drives the fifth signal line such that the fifth switch connects the first power line and the fifth power line, and following a predetermined period, drives the sixth signal line such that the sixth switch connects the second power line and the fifth power line in accordance with the logical values of the potential detection signals.

14. The semiconductor device according to claim 13, further comprising:
a first circuit group to which voltage is supplied from the second power line; and
a second circuit group to which voltage is supplied from the third power line.

* * * * *